United States Patent
Goebel et al.

(12) 
(10) Patent No.: US 6,172,391 B1
(45) Date of Patent: Jan. 9, 2001

(54) DRAM CELL ARRANGEMENT AND METHOD FOR THE MANUFACTURE THEREOF

(75) Inventors: Bernd Goebel; Emmerich Bertagnolli, both of Munich (DE); Helmut Klose, Poughkeepsie, NY (US)

(73) Assignee: Siemens Aktiengesellschaft, Munich (DE)

(*) Notice: Under 35 U.S.C. 154(b), the term of this patent shall be extended for 0 days.

(21) Appl. No.: 09/140,972

(22) Filed: Aug. 27, 1998

(30) Foreign Application Priority Data

Aug. 27, 1997 (DE) ................................ 197 37 386

(51) Int. Cl.⁷ ........................ H01L 29/78; H01L 29/92
(52) U.S. Cl. .................. 257/305; 257/302; 257/398; 257/399
(58) Field of Search .............................. 257/302, 305, 257/398, 399

(56) References Cited

U.S. PATENT DOCUMENTS

| | | |
|---|---|---|
| 4,630,088 | 12/1986 | Ogura et al. . |
| 4,926,224 * | 5/1990 | Redwine ............................... 257/302 |
| 5,103,276 * | 4/1992 | Sheu ...................................... 257/302 |
| 5,214,603 | 5/1993 | Dhong et al. . |
| 5,376,575 | 12/1994 | Kim et al. . |

FOREIGN PATENT DOCUMENTS

| | | |
|---|---|---|
| 196 20 625 | 5/1996 | (DE) . |
| 195 19 160 C1 | 9/1996 | (DE) . |
| 0 261 666 A1 | 3/1988 | (EP) . |

OTHER PUBLICATIONS

Proc. Intern. Electronic Devices and Materials IEDM 85, K. Yamada et al, "A Deep–Trenched Capacitor Technology for 4 Mega Bit Dynamic Ram", pp. 702–705.

* cited by examiner

Primary Examiner—Jerome Jackson, Jr.
(74) Attorney, Agent, or Firm—Schiff Hardin & Waite

(57) ABSTRACT

An element that prevents the formation of a channel is arranged in a level of the channel region (Kaa) at one of two opposite sidewalls of a semiconductor structure that has a source/drain region (S/D1a) and a channel region (Kaa) of a vertical selection transistor arranged therebelow. The source/drain region as well as a respective word line (W1a) adjoin at both sidewalls. For folded bit lines (B1a), respectively two word lines (W1a) can be formed in the trenches (G2a). The elements of semiconductor structures neighboring along one of the trenches (G2a) are then arranged in alternation at a sidewall of the trench (G2a) and at a sidewall of a neighboring trench (D2a). A storage capacitor can be arranged over a substrate (1a) or can be buried in the substrate (1a). The connection of the selection transistor to a bit line (B1a) can ensue in many ways.

11 Claims, 13 Drawing Sheets

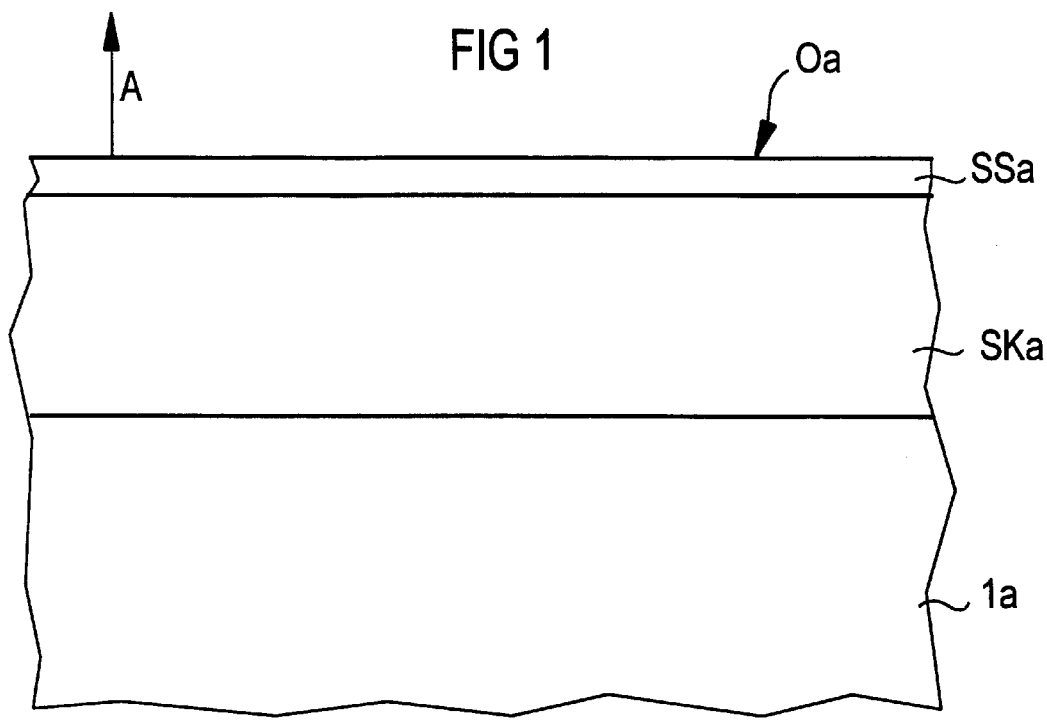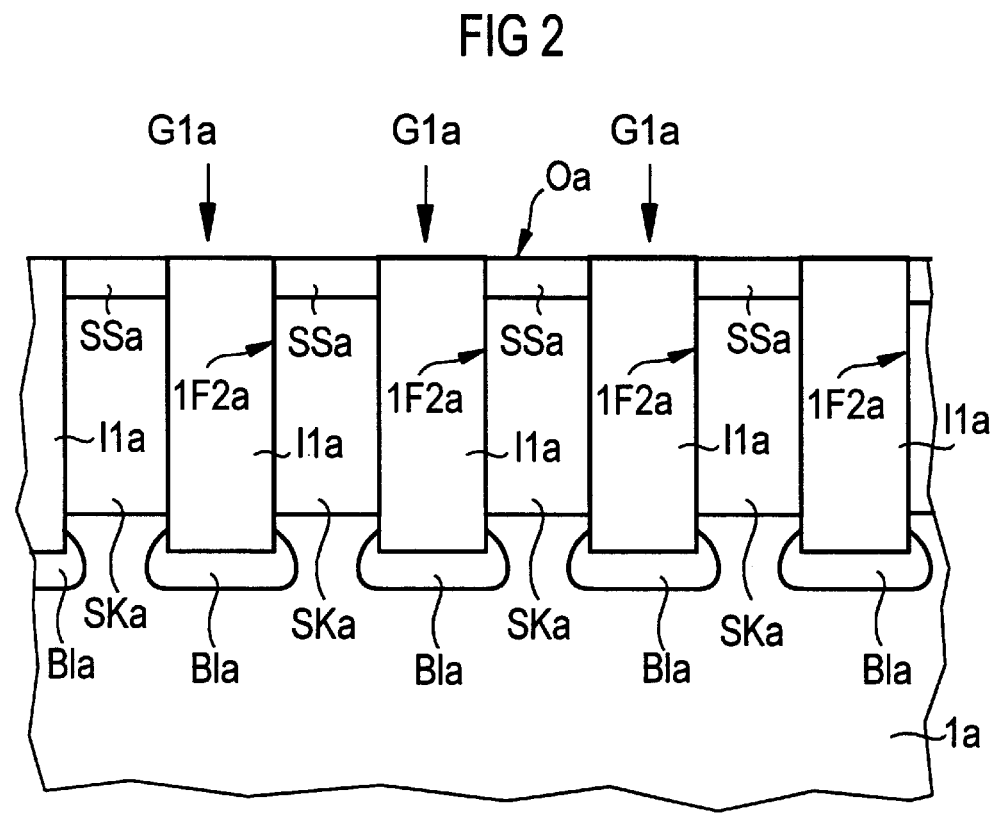

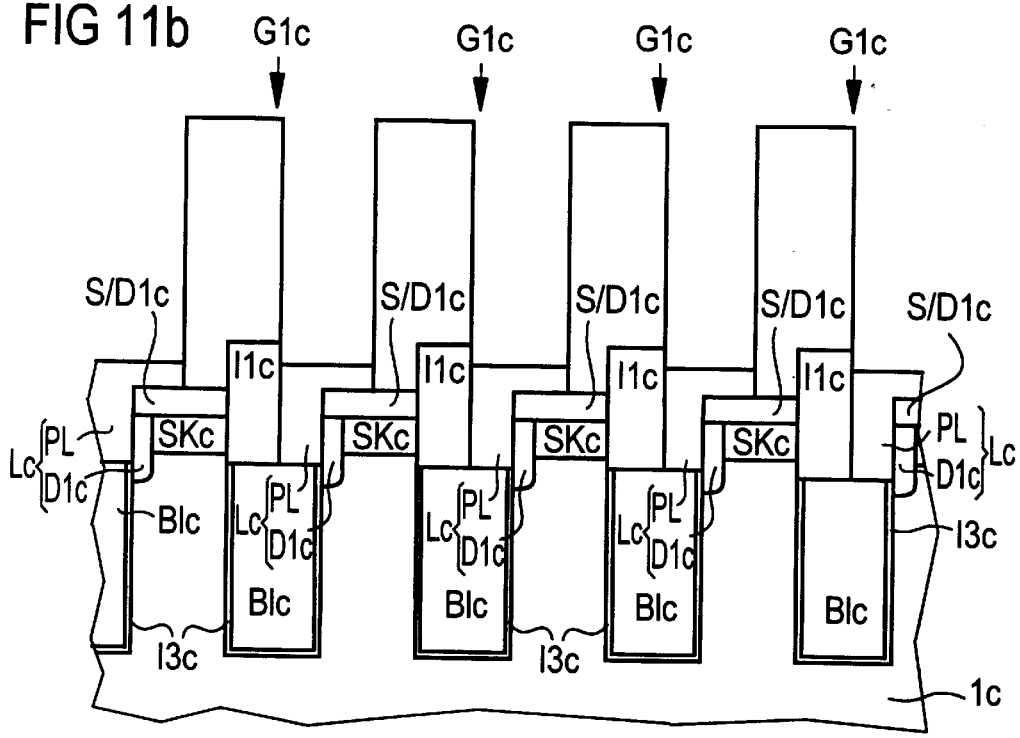
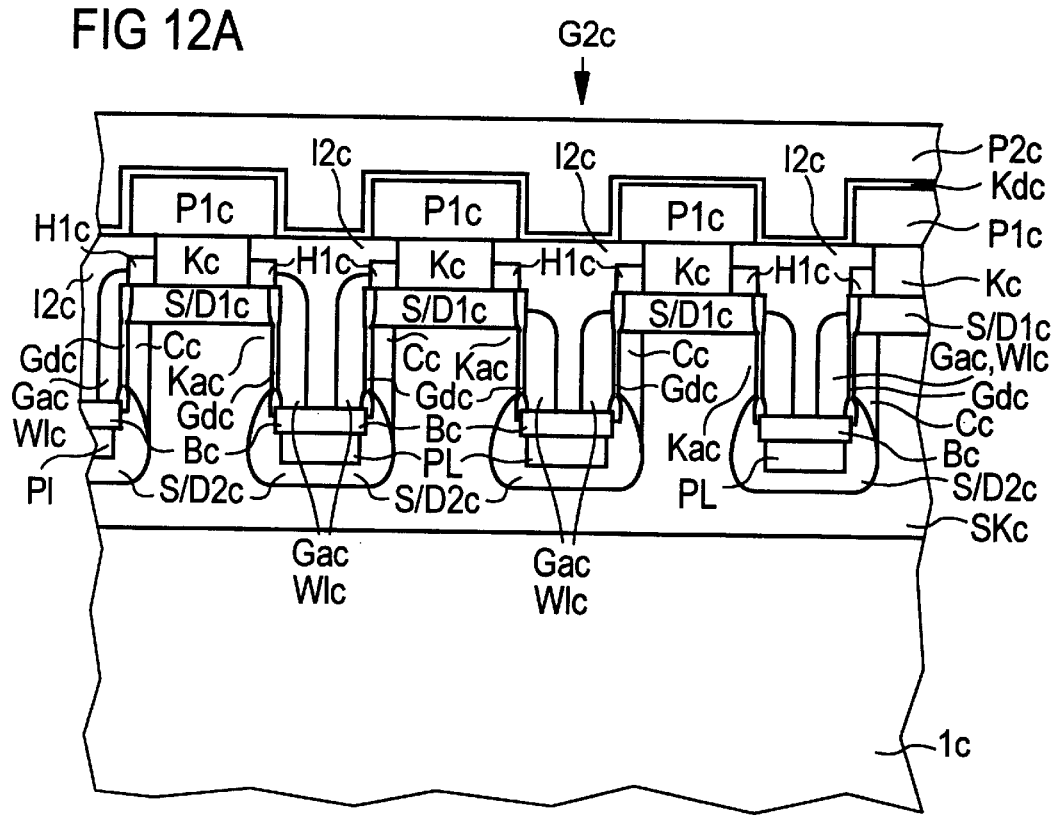

DRAM CELL ARRANGEMENT AND METHOD FOR THE MANUFACTURE THEREOF

BACKGROUND OF THE INVENTION

What are referred to as single transistor memory cells are almost exclusively utilized in DRAM cell arrangements, i.e. memory cell arrangements with dynamic, random access. A single-transistor memory cell has a selection transistor and a storage capacitor. The information in the form of an electrical charge is stored in the storage capacitor, this representing a logical quantity, 0 or 1. This information can be read out via a bit line by driving the selection transistor via a word line.

Since the storage density increases from memory generation to memory generation, the required area of the single-transistor memory cell must be reduced from generation to generation. Since the reduction of the structural sizes has limits placed upon it by the minimum structural size F manufacturable in the respective technology, this also involves a modification of the single transistor memory cell. Up to the 1MBit generation, thus, both the selection transistor as well as the storage capacitor were realized as planar components. Beginning with the 4MBit memory generation, a further reduction in area had to ensue on the basis of a three-dimensional arrangement of selection transistor and storage capacitory.

One possibility is realizing the storage capacitor not in planar fashion but in a trench (see, for example, K. Yamada et al., "A Deep Trenched Capacitor Technology For 4MBit DRAMs", Proc. Intem. Electronic Devices and Materials IEDM 85, page 702).

Another possibility is employing vertical MOS transistors as disclosed, for example, in U.S. Pat. No. 5,376,575.

The earlier German Patent Application 196 20 625.1 discloses a DRAM cell arrangement whose selection transistors are fashioned as vertical MOS transistors above storage capacitors. To that end, first trenches and second trenches transverse thereto are generated in a substrate. The storage capacitors are respectively arranged in the trenches. Respectively two of the second trenches form a trench pair that is surrounded by an insulation structure. A semiconductor island is arranged between the second trenches of each trench pair. A first selection transistor with a first gate electrode is arranged at a first, common sidewall of the semiconductor island and of a first of the two second trenches, and a second transistor with a second gate electrode is arranged at a second, common sidewall of the semiconductor island and of a second of the two second trenches. A respective storage node of the storage capacitors is adjacent at one of the sidewalls of the semiconductor island. In order to enable folded bit lines, the semiconductor islands are respectively arranged offset relative to one another along neighboring, first trenches. Given folded bit lines, the signal of the appertaining bit line is compared to the signal of a neighboring bit line for reading of the information of the selection transistor. The word line via which the selection transistor is driven cannot be connected to any selection transistor that is connected to the neighboring bit line. Disturbances and signal background that are the same on the bit lines lying extremely close to one another can thereby be nearly eliminated. This is advantageous, since the signal that must be interpreted as the bit line becomes smaller and smaller with the reduction of the structural size.

German reference DE 195 191 60 C1 discloses a DRAM cell arrangement that has a vertical MOS transistor per memory cell whose first source/drain region is connected to a storage node of a storage capacitor whose channel region is annularly surrounded by a gate electrode and whose second source/drain region is connected to a bearing bit line. The storage capacitor is either a planar capacitor or a stacked capacitor.

U.S. Pat. No. 4,630,088 discloses a DRAM cell arrangement wherein a capacitor of a memory cell is connected between a selection transistor of the memory cell and a bit line. A word line is arranged at each of two opposite sidewalls of a strip-shaped semiconductor structure. The semiconductor structure comprises an upper and a lower source/drain region of the selection transistor. A channel region is arranged between the source/drain regions. The upper source/drain region is adjacent at one of the two sidewalls. A doped region that is doped of the same conductivity type as that of the channel region but exhibits a higher dopant concentration is arranged next to the upper source/drain region. The doped region effects that the read-out transistor is only driven by the word line that is arranged at the sidewall of the semiconductor structure which is adjoined by the upper source/drain region.

U.S. Pat. No. 5,214,603 disdoses a DRAM cell arrangement wherein a selection transistor of a memory cell is connected between a capacitor of the memory cell and a bit line. Word lines are arranged at sidewalls of trenches that proceed parallel to one another. A semiconductor structure is arranged between two of the trenches and comprises a source/drain region shared by the two selection transistors and two lower source/drain regions of the selection transistors. A doped region that is doped of a conductivity type opposite the conductivity type of the source/drain regions is arranged between the upper and the lower source/drain regions. Insulating structures that are arranged between the trenches are arranged between neighboring semiconductor structures that are parallel or perpendicular to the trenches.

SUMMARY OF THE INVENTION

It is an object of the present invention to provide a DRAM cell arrangement that has single-transistor memory cells as memory cells and that can be manufactured with especially high packing density. Further, the present invention is also a manufacturing method for such a DRAM cell arrangement.

In an inventive DRAM cell arrangement, memory cells respectively have a semiconductor structure that has at least one of two source/drain regions and a channel region of a vertical selection transistor arranged therebelow. The selection transistor is fashioned as an MOS transistor. The semiconductor structure has two sidewalls lying opposite one another at which the source/drain region is adjacent. The channel region is adjacent to one of the two sidewalls of the semiconductor structure. A gate dielectric adjoins the channel region, a gate electrode that is connected to a first word line adjoining the gate dielectric. An element that prevents the formation of a channel is arranged at another of the two sidewalls of the semiconductor structure at a level of the channel region. A second word line is adjacent at the element that prevents the formation of a channel. The element is arranged under the source/drain region, so that the DRAM cell arrangement exhibits a higher packing density then the DRAM cell arrangement according to U.S. Pat. No. 4,630,088. A first source/drain region of the selection transistor is connected to a storage capacitor. A second source/drain region of the selection transistor is connected to a bit line that proceeds transverse to the first word line. A memory cell of the DRAM cell arrangement can be manufactured with an area of $4F^2$.

The element that prevents the formation of a channel can be fashioned as a channel stop zone. The channel stop zone is doped with the same conductivity type as the channel region but exhibits a higher dopant concentration. Second trenches that separate semiconductor structures from one another can be generated for generating the channel stop zones. The channel stop zones arise by oblique implantation at first sidewalls and/or at second sidewalls of the second trenches. Channel stop zones can also arise by drive-out of dopant of an auxiliary material that is in turn subsequently removed. Alternatively, the elements can be generated in the form of spacers of insulating material at the first sidewalls and/or at the second sidewalls of the second trenches.

It is advantageous to fashion the DRAM cell arrangement with folded bit lines. To that end, respectively two word lines are generated along the second trenches. Elements that prevent the fashioning of channels of memory cells neighboring along a word line are arranged in alternation adjacent at the first sidewalls and second sidewalls of the second trenches. As a result thereof, the word line via which a selection transistor that is connected to a bit line is driven is not connected to a selection transistor that is connected to a bit line neighboring the bit line. Elements that prevent the fashioning of channels of memory cells neighboring along the bit line can, for example, all either adjoin first sidewalls or all adjoined second sidewalls of the second trenches. Alternatively, the elements that prevent the fashioning of channels of memory cells neighboring along the bit line can adjoin the first sidewalls and the second sidewalls of the second trenches in alternation. Word lines can be fashioned in the form of spacers.

For process simplification, it lies within the scope of the invention to forego folded bit lines. The second trenches are respectively essentially filled by a word line. So that memory cells that are connected to the same bit line are respectively driven by different word lines, the elements that prevent the fashioning of channels of memory cells neighboring along the bit line are either all fashioned joining the first sidewalls or all fashioned adjoining the second sidewalls of the second trenches. Where the elements that prevent the fashioning of channels are realized in the form of channel stop zones generated by oblique implantation, it is advantageous for reducing the process outlay when the elements are all fashioned adjoining the first sidewalls or the second sidewalls of the second trenches. Masks can thereby be foregone in the generation of the channel stop zones.

The storage capacitor can either be buried in a substrate or arranged above the substrate.

When the capacitor is arranged above the substrate, the second source/drain region can either be part of the bit line or can be connected to the bit line via a conductive structure. In both instances, first trenches proceeding parallel to the bit lines can be generated, these being at least partially filled with insulating material that adjoins the bit lines up to the upper edges. The insulating material forms first insulating structures. The second trenches are generated transverse to the first trenches, said second trenches being respectively at least partially shallower than the first trenches in that the insulating material is etched with the assistance of a mask in regions that overlap with the first trenches and the semiconductor material is etched with the assistance of a mask in regions that lie outside the first trenches. The word lines are generated within the second trenches. The first insulating structures separate neighboring memory cells from another along respectively one. of the second trenches. When the second source/drain region is part of the bit line, then a layer for bit lines, a layer for channel regions thereabove and a layer for source/drain regions thereabove can be generated, for example by implantation and/source epitaxy. The layer for the channel regions is doped with a conductivity type opposite conductivity types of the layer for the bit lines and of the layer for the source/drain regions. The first trench is proceeding parallel to one another that cut through the layer for the bit lines are generated for generating the bit lines. As a result thereof, the bit lines arise from the layer for the bit lines between the first trenches. The first insulating structures insulate the bit lines from one another. As a result of the production of the first trenches and of the second trenches, the first source/drain region and the channel region arise from the layer for the source/drain regions and from the layer for the channel regions.

When the second source/drain region is connected to the bit line via a conductive structure, then the bit line can be arranged below and laterally relative to the second source/drain region with reference to an axis that proceeds perpendicular to a surface of the substrate. To that end, the bit lines are generated along the first trenches. The substrate can comprise a layer for the channel regions that, for example, is produced by implantation and/or epitaxy. The substrate can be doped both with the conductivity type of the layer for the channel regions as well as with an opposite conductivity type. The first source/drain region arises, for example, by generating the first trenches and the second trenches from a layer for the source/drain regions that, for example, is generated by surface-wide implantation in the layer for the channel regions.

Alternatively, the first source/drain region can be generated by masked implantation. The second source/drain region arises, for example, at a part of a floor of one of the second trenches, for example by implantation and tempering. The tempering not only activates the dopant but also effects an expansion of the second source/drain region, particularly laterally and in height, as a result whereof the height of the second source/drain region lies above the floor of the second trench. Alternatively, the second source/drain region is generated before the layer for the channel regions, that is then produced by epitaxy.

The bit lines can be generated by implantation of floors of the first trenches.

Alternatively, the bit lines arise in that the first trenches are partially filled with doped polysilicon. For insulating the bit lines from the substrate, dopant from the bit lines is driven out in a tempering step, as a result whereof a second diffusion region arises that separates the bit lines from the substrate. The substrate is doped with a conductivity type opposite the conductivity type of the bit lines. Instead of employing the doped polysilicon as the bit lines, the polysilicon can be removed after the production of the second diffusion regions. Subsequently, another conductive material is deposited and etched, the bit lines that are electrically insulated from the substrate by the second diffusion regions arising therefrom.

Alternatively, the sides of the first trenches can first be provided with a third insulating structure. By partially filling the firs trenches with conductive materials such as, for example, silicide, polycide, polysilicon and/or metal, the bit lines that are separated from the substrate by the third insulating structures then arise.

In order to keep the capacitance that is formed by the bit line and the substrate small, it is advantageous when the third insulating structures contain material having a low dielectric constant such as, for example, borosilicate glass. It is advantageous to remove parts of the third insulating structures lying exposed after production of the bit lines. The process outlay is thereby reduced when parts of sidewalls of the first trenches are uncovered in a plurality of process steps. When the first insulating structures are generated before the conductive structure, then at least a part of one of the first insulating structures that adjoins a sidewall of the first trench at which the conductive structure is to arise is removed until the bit line is partially uncovered.

In order to keep the capacitance that is formed by the bit line and the substrate particularly small, both second diffusion regions as well as third insulating structures can be formed.

A first diffusion region that adjoins the bit line and the second source/drain region is generated for the conductive structure, for example by oblique implantation.

The conductive structure can also be generated by deposition and re-etching of conductor material. For example, the conductive material can be present in the form of doped polysilicon for insulating the conductive material from the substrate. The first diffusion region that serves not only as additional part of the conductive structure but also electrically insulates the doped polysilicon from the substrate arises by drive-out in a tempering step. To that end, the substrate is doped with a conductivity type opposite the conductivity type of the doped polysilicon. Alternatively, insulating material, for example a part of the third insulating structure or a spacer-shaped structure, can insulate the conductive material from the substrate. The conductive material can then, for example, contain metal, metal suicide or doped polysilicon.

It lies within the scope of the invention to generate a sixth auxiliary layer of insulating material above the second source/drain region and to generate a seventh auxiliary layer above said sixth auxiliary layer. The seventh auxiliary layer protects the sixth auxiliary layer in the partial removal of the first insulating structure before the production of the conductive structure. The sixth auxiliary layer protects parts of the DRAM cell arrangement lying therebelow during the etching of the conductor material for producing the conductive structure.

So that, given production of the word lines of a DRAM cell arrangement with folded bit lines, the word lines are not shorted by undesired formation of spacers at edges proceeding transverse to the second trenches, the second trenches must be provided with essentially planar floors. To that end, the etching depth when etching the insulating material at the etching depth when etching the semiconductor material. approximately coincide with one another.

The degree of coincidence of the etching depths can be lower when the planar floors subsequently arise as surfaces of floor structures. The floor structures are produced after the generation of the conductive structure by deposition of material that at least fills the second trenches and etching down to a depth that is greater than the originally greatest depth of the second trenches with reference to the axis.

For insulating the word lines and/or for reducing capacitances in which the word lines participate, the floor structures are preferably manufactured of insulating material.

So that the gate electrode that is generated within a second trench provided with a planar floor can drive the second source/drain region, the height of the planar floor dare not exceed the height of the second source/drain region. The height of the second source/drain region does not lie significantly above the height of the original floors of the second trenches when the second source/drain region is produced at a part of the floors of the second trenches by implantation and tempering before producing the floor structures. When the planar floors of the second trenches are formed by floor structures, then the vertical tolerance for setting the height of the planar floors is consequently slight. It is therefore advantageous to etch semiconductor material after production of the second source/drain regions, so that the second trenches become partially deeper. As a result thereof, the vertical tolerance in the setting of the height of the planar floors can be increased. When the second source/drain region is part of the bit line, it is adequate for enlarging the vertical tolerance to produce the second trenches deep enough so that the height of the second source/drain region is not influenced in this case by the depth of the second trenches.

After producing the first insulating structures on the second source/drain region, it lies within the scope of the invention to produce a first auxiliary layer of insulating material that increases the vertical tolerance in the re-etching for producing the spacer-shaped word lines. The gate electrode can partially adjoin the first auxiliary layer.

After producing the first insulating structures on the second source/drain regions, it lies within the scope of the invention to generate a second auxiliary layer and to generate a third auxiliary layer thereabove. The third auxiliary layer is structured with the assistance of a photolithographic process, serves as mask in the production of the second trenches and protects the second auxiliary layer. The second auxiliary layer is selectively etchable relative to the first insulating structure and the material for generating the planar floor. When producing the planar floor, the second auxiliary layer serves as mask and protects parts of the first insulating structures. When the first auxiliary layer is also produced, then the second auxiliary layer is arranged on the first auxiliary layer. When the sixth auxiliary layer and the seventh auxiliary layer are also produced, then the sixth auxiliary layer is generated on the second auxiliary layer and the third auxiliary layer is generated on the seventh auxiliary layer.

When only the first auxiliary layer is produced, it can serve as mask in the production of the second trenches.

It lies within the scope of the invention to produce contacts to source/drain regions. When the storage capacitor is arranged above the substrate, then the contacts connect the first source/drain regions to first capacitor plates of the storage capacitors. When the storage capacitor is buried in the substrate, then the contacts connect the second source/drain regions to the bit lines.

The contacts can be produced by masked etching of a third insulating structure and filling up the depressions that thereby arise with conductive material.

For increasing the packing density, the contacts can be generated self-aligned, i.e. without employing masks to be aligned. To that end, the first auxiliary layer is produced of insulating material above the source/drain regions and the second auxiliary layer is produced of semiconductor material above the source/drain regions. After producing the gate electrodes, insulating material is deposited and planarized until the second auxiliary layer is uncovered. Subsequently, semiconductor material is etched selectively relative to the insulating material until the second auxiliary layer is removed. As a result thereof, depressions arise above the source/drain regions and the insulating material is thinner above the source/drain regions than above the gate electrodes. When the insulating material is then subsequently etched until the first auxiliary layer is removed and the source/drain regions are uncovered, the depressions shift downward and insulating material remains above the gate electrodes. As a result thereof, contacts arise in the depressions by deposition of conductor material and etching until insulating material is uncovered.

Alternatively, the contacts can be foregone. To that end, the gate electrodes are etched back to a point below an upper edge of the source/drain regions. A second insulating structure is produced in that insulating material is deposited and etched until the source/drain regions are uncovered but the gate electrodes are not uncovered. The first capacitor plates or, respectively, the bit lines are then produced by deposition and structuring of conductor materials such as, for example, tungsten, platinum or polysilicon, being produced directly adjoining the source/drain regions.

When the storage capacitor is buried in the substrate, it is advantageous when a highly doped layer is produced for the first source/drain regions. The layer of the first source/drain regions is produced, for example, by implantation of the substrate. A lightly doped layer for the channel regions is produced by epitaxy on the layer for the first source/drain regions. The second source/drain regions are produced by implantation and/or epitaxy. To that end, regions for the second source/drain regions can be produced in the layer for the channel regions by implantation with the assistance of a mask. The regions for the second source/drain regions can, for example, proceed stripe-shaped parallel to one another and can be highly doped. It lies within the scope of the invention to produce a fourth auxiliary layer of insulating material above the second source/drain regions, a fifth auxiliary layer of semiconductor material and the third auxiliary layer of insulating material.

It lies within the scope of the invention to generate the first auxiliary layer before the production of the fourth auxiliary layer and to generate the second auxiliary layer thereabove with the appertaining properties and functions cited above in the production of the contacts. The structured, third auxiliary layer serves as mask for the production of the second trenches. When the regions for the second source/drain regions are stripe-shaped, then the second trenches are produced perpendicular to the regions, as a result whereof the second source/drain regions arise from the regions.

It lies within the scope of the invention to deposit insulating material after the production of the channel stop zones and to planarize this until the fifth auxiliary layer is uncovered. The third auxiliary layer is thereby removed. The insulating material is partially removed from the second trenches with the assistance of a mask complimentary to the mask for producing the regions of the second source/drain regions, whereby the fifty auxiliary layer protects the fourth auxiliary layer. Hole-like depressions in which the first source/drain regions are produced by implantation and tempering thereby arise in the second trenches. Insulating material that remains in the second trenches serves as insulating structure that separates transistors neighboring along a second trench from one another. The storage nodes are connected self-aligned to the first source/drain regions in that semiconductor material is etched after producing the first source/drain regions, the capacitor dielectric is generated and, subsequently, conductor material is deposited and re-etched until the height of the storage node lies in the area of the first source/drain regions. The fifth auxiliary layer is thereby removed and the fourth auxiliary layer protects the second source/drain regions or, respectively, the second auxiliary layer. Uncovered parts of the capacitor dielectric are removed in order to enable a connection between the storage nodes and the first source/drain regions. Subsequently, conductive material is deposited and re-etched, so that the storage nodes are respectively connected to one of the first source/drain regions. After producing a gate dielectric, the gate electrodes are generated self-aligned relative to the storage nodes in that material is deposited and etched.

It is advantageous for increasing the capacity of the storage capacitor when a layer of the substrate at which the capacitor dielectric adjoins is highly doped. The layer for the first source/drain regions is then epitaxially ground onto the layer of the substrate. Alternatively, the substrate can also be highly doped essentially only in the environment of the capacitor dielectric. To that end, dopant is introduced into the substrate before the generation of the storage node. This occurs, for example, by deposition of doped polysilicon, tempering and subsequent removal of the polysilicon.

The first source/drain region can generally be either n-doped or p-doped.

For increasing the capacity of the storage capacitor, it is advantageous when the capacitor dielectric contains material having a high dielectric constant such as, for example $Ba_xSr_{1-x}TiO_3$, tantalum pentoxide or Perovskite. When the storage capacitor is arranged above the substrate, it is advantageous for forming good boundary surfaces given some materials with high dielectric constant when the capacitor plates contain platinum, ruthenium, iridium and/or rutheniumoxide. When the storage capacitor is buried in the substrate, it is simpler when the capacitor dielectric comprises $SiO_2$, an ON layer, a NO layer and/or an ONO layer "O" thereby stands for an oxide and "N" stands for silicon nitride.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows a cross-section through a first substrate that has a layer for channel regions in which a layer for source/drain regions was produced;

FIG. 2 shows the cross-section of FIG. 1 after first trenches, bit lines and first insulating structures were produced;

FIG. 3b shows the cross-section of FIG. 2 after the steps from FIG. 3a;

FIG. 4b shows the cross-section from FIG. 3b after the process steps from FIG. 4a;

FIG. 10b shows the cross-section from FIG. 9 after the process steps from FIG. 10a;

FIG. 11b shows the cross-section of FIG. 10b after the process steps of FIG. 11a;

FIG. 12a shows the cross-section of FIG. 11a after floor structures, a gate dielectric, word lines, gate electrodes, a second insulating structure, contacts, first capacitor plates, a capacitor dielectric and a second capacitor plate were produced;

FIG. 12b shows the cross-section of FIG. 11b after the process steps of FIG. 12a;

FIG. 15b shows the cross-section of FIG. 14b after the process steps of FIG. 15a;

DESCRIPTION OF THE PREFERRED EMBODIMENTS

Figure 3A:
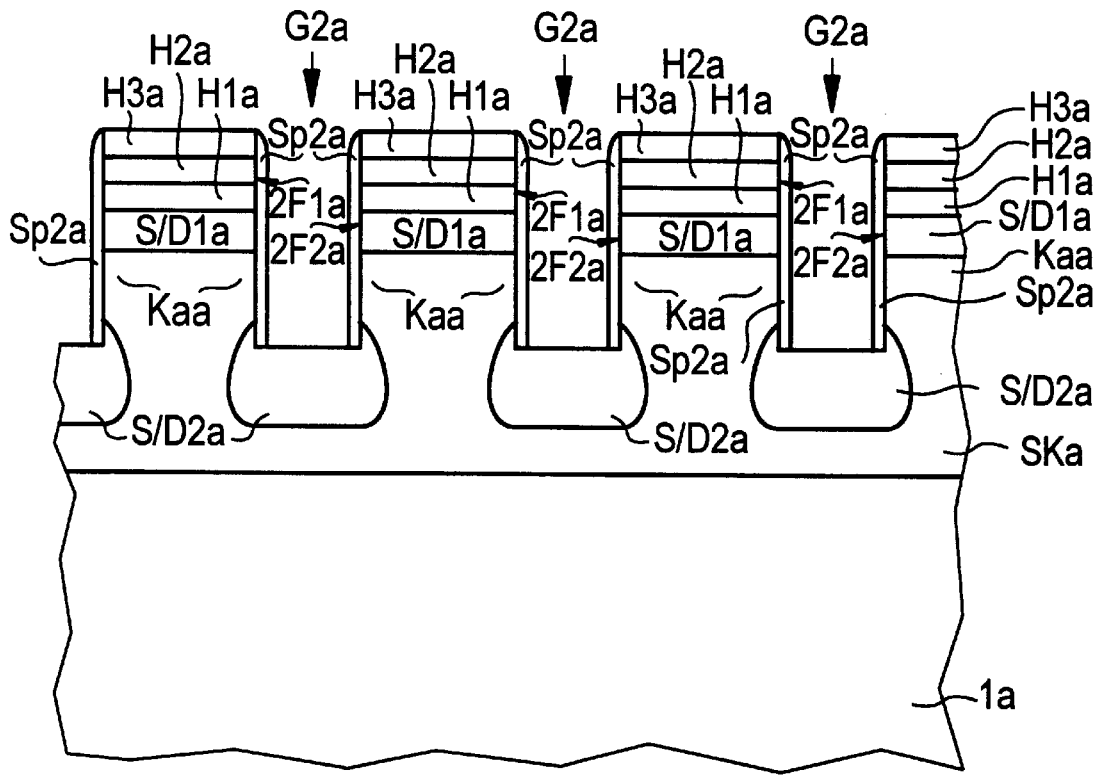
FIG. 3a shows a cross-section perpendicular to FIG. 2 after a first auxiliary layer, a second auxiliary layer, a third auxiliary layer, second trenches, first source/drain regions, channel regions, second spacers and second source/drain regions were produced.

In a first exemplary embodiment, an initial material is a first substrate 1a that contains p-doped silicon and whose dopant concentration amounts to approximately $10_{15}$ cm$^{-3}$. An n-doped layer SSa for a first source/drain regions S/D1a a is produced by implantation in a p-doped layer SKa adjoining a surface Oa of the substrate 1a for channel regions Kaa of the substrate 1a whose dopant concentration amounts to approximately $10^{17}$ cm$^{-3}$ and that is approximately 1 μm deep. The dopant concentration of the layer SSa for the first source/drain regions S/D1a amounts to approximately $5 \times 10^{20}$ cm$^{-3}$. The layer SSa of the first source/drain regions S/D1a is approximately 150 nm deep (see FIG. 1).

For producing a first mask (not shown), SiO$_2$ is deposited in a thickness of approximately 200 nm in a TEOS process. SiO$_2$ is etched with, for example, CHF$_3$+O$_2$ in a photolithographic process, as a result whereof the first mask arises that covers stripe-shaped regions proceeding parallel to one another. With the assistance of the first mask, approximately 1.2 μm deep, first trenches G1a are produced by etching silicon (see FIG. 2). For example, Hbr+NF$_3$+He+O$_2$ is suitable as etchant. The spacing between center lines of two neighboring, first trenches G1a amounts to approximately 1 μm. First spacers (not shown) are produced by deposition of SiO$_2$ in a thickness of approximately 50 nm and re-etching. By implantation, n-doped bit lines B1a are produced at floors of the first trenches G1a. The bit lines are approximately 150 nm deep and the dopant concentration of the bit lines B1a amounts to approximately $5 \times 10^{20}$ cm$^{-3}$. The first spacers protect sidewalls of the first trenches G1a during the implantation (see FIG. 3).

Subsequently SiO$_2$ is deposited in a thickness of approximately 500 nm in a TEOS process and is planarized by chemical-mechanical polishing until the surface Oa is uncovered. First insulating structures I1a thereby arise (see FIG. 2).

SiO$_2$ is deposited in a thickness of approximately 100 nm for producing a first auxiliary layer H1a. Polysilicon is deposited thereover in a thickness of approximately 100 nm for producing a second auxiliary layer H2a. SiO$_2$ is deposited in a thickness of approximately 100 nm thereover for producing a third auxiliary layer H3a. First, SiO$_2$ is etched with, for example, CHF$_3$+O$_2$ in a photolithographic process until the second auxiliary layer H2a is partially uncovered. Subsequently, polysilicon is etched with, for example, C$_2$F$_6$O$_2$ until the first auxiliary layer H1a is partially uncovered. Subsequently, SiO$_2$ is etched with CH$_3$O$_2$ until an upper edge of the first insulating structure I1a partially lies 500 nm under the surface Oa with reference to an axis a that proceeds perpendicular to the surface O. Subsequently, silicon is etched to a depth of approximately 500 nm, whereby the third auxiliary layer H3a serves as second mask. As a result thereof, second trenches G2a that extend into the layer SKa for the channel regions Kaa and that proceed perpendicular to the first trenches G1a arise. The pacing between center lines of two neighboring, second trenches G2a amounts to approximately 1.25 μm (see FIG. 3a and FIG. 3b). Due to the production of the second trenches G2a and of the first trenches G1a, channel regions Kaa arise from the layer SKa for the channel regions Kaa and the first source/drain regions S/D1a arise from the layer for the first source/drain regions S/D1a. The first source/drain regions S/D1a and the channel regions Kaa are laterally surrounded by the first trenches G 1a and the second trenches G2a.

Figure 3B:
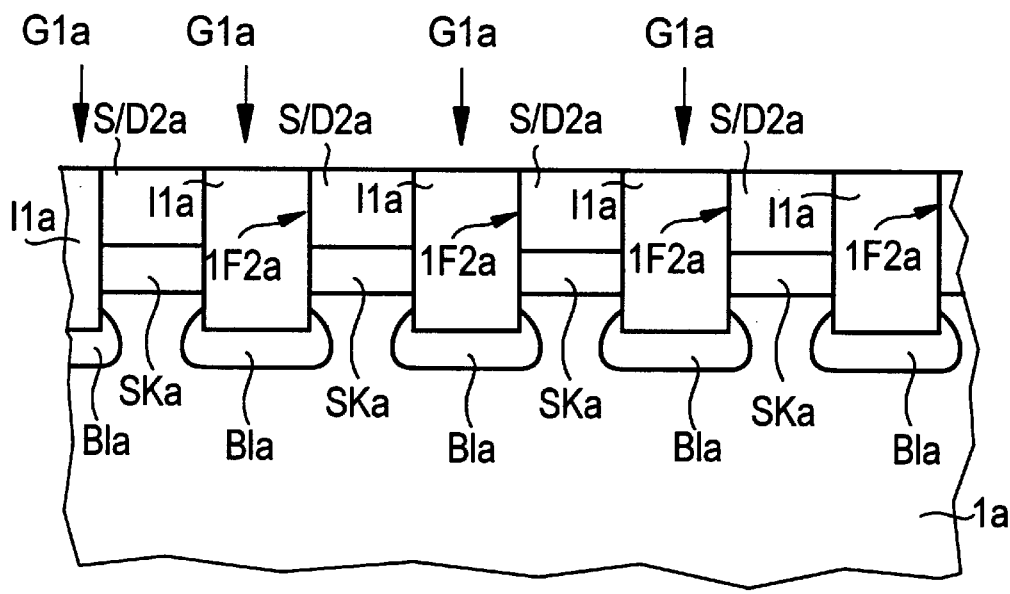

Approximately 50 nm $SiO_2$ is deposited and re-etched for generating second spacers Sp2a (see FIG. 3a). By implantation, n-doped second source/drain regions S/D2a are produced at floors of the second trenches. The dopant concentration of the second source/drain region S/D2a amounts to approximately $5 \times 10^{20}$ cm$^{-3}$. As a result of a tempering step, the source/drain regions S/D2a expand, as a result whereof an upper edge of the second source/drain regions S/D2a proceeds laterally and above the floors of the second trenches G2a. The dopant of the second source/drain regions S/D2a is also activated by the tempering step. The second source/drain regions S/D2a are approximately 300 nm deep. Parts of the first insulating structure I1a outside the second trenches G2a separate memory cells neighboring along the second trenches G2a from one another. The second spacers Sp2a protect sidewalls of the second trenches G2a in the implantation of the second source/drain regions S/D2a.

Figure 4A:
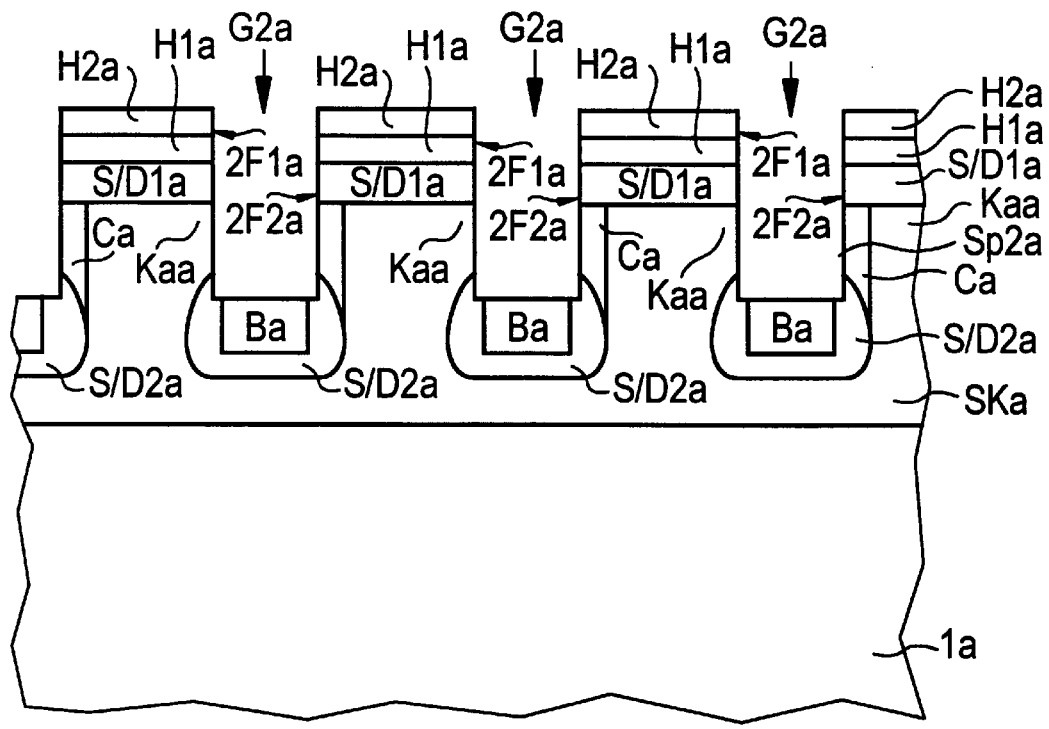
FIG. 4a shows the cross-section from FIG. 3a after first diffusion regions (shown at FIG. 4b), floor structures and channel stop zones have been produced.
Figure 4B:
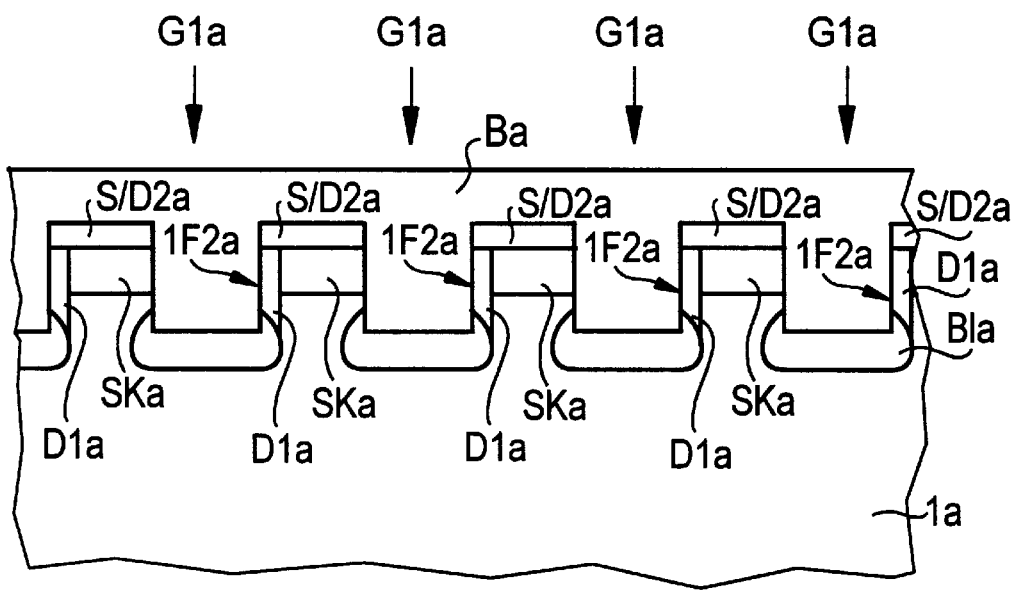

Subsequently, silicon is etched with, for example, Hbr+ $NF_3$+He+$O_2$, as a result whereof the second trenches G2a become approximately 200 nm deeper in regions outside the first trenches G1a. By etching $SiO_2$ selectively relative to polysilicon and silicon, the second spacers Sp2a and parts of the first insulating structure I1a that are arranged within the second trenches G2a are removed. Third spacers (not shown) are produced at sidewalls of the second trenches G2a by deposition of $SiO_2$ in a thickness of approximately 50 nm and re-etching. By oblique implantation, n-doped, first diffusion regions D1a are produced at second sidewalls 1F2a of the first trenches G1a located within the second trenches G2a. The first diffusion regions D1a respectively adjoin a bit line B1a and a second source/drain region S/D2a. The third spacers protect other sidewalls in the implantation. The dopant concentration of the first diffusion regions D1a amounts to approximately $10^{20}$ cm$^{-3}$ (see FIG. 4b).

Subsequently, approximately 500 nm $SiO_2$ is deposited [in] a TEOS process and is eroded by chemical-mechanical polishing until the second auxiliary layer H2a is uncovered. Floor structures Ba that form planar floors in the second trenches are produced in the second trenches G2a by re-etching of $SiO_2$ with, for example, $CHF_3$+$O_2$ (see FIGS. 4a and 4b). The planar floors lie approximately 500 nm below the surface Oa and thus lie just below the upper edge of the second source/drain regions S/D2a. The partially deeper etching of the second trenches G2a increases the vertical tolerance for the height of the planar floors of the second trenches G2 (see FIG. 4a).

Figure 5:
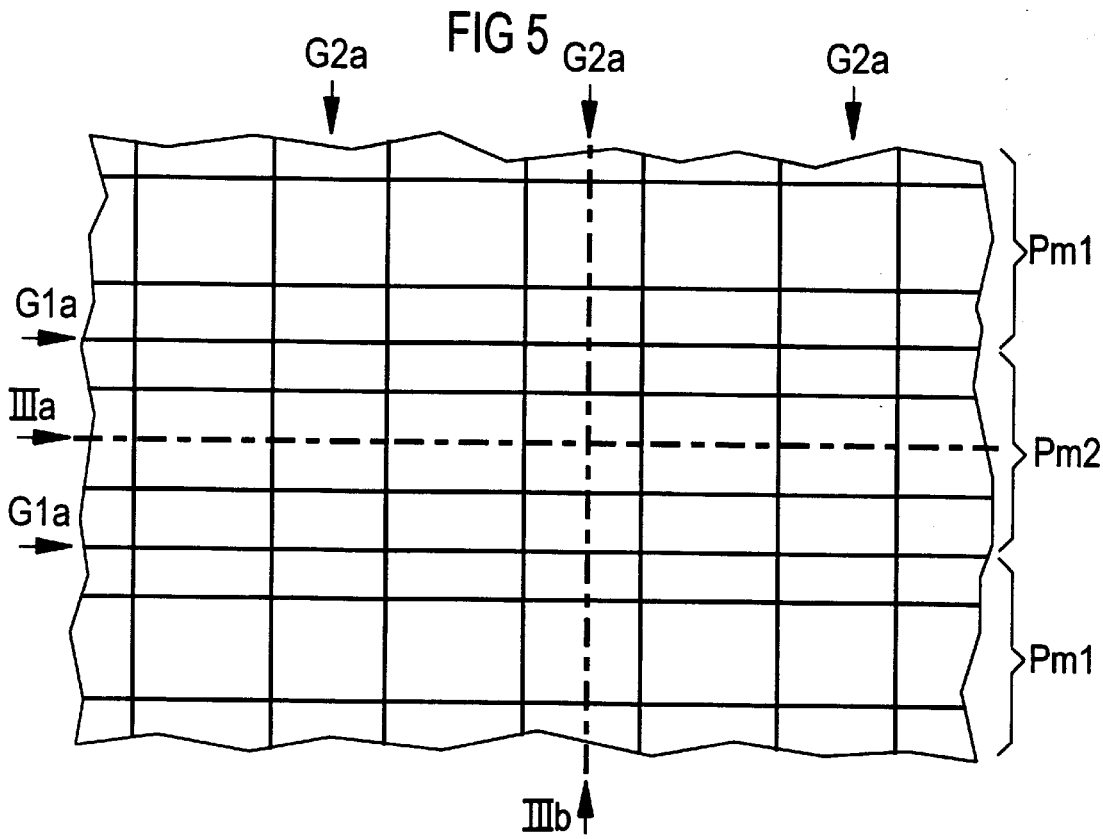
FIG. 5 shows a plan view onto the first substrate in which the first photo-resist mask and the second photoresist mask with whose assistance the channel stop zones were generated and the first trenches and the second trenches are shown.

With the assistance of a first photoresist mask Pm1 that covers every second region lying between two neighboring first trenches G1, channel stop zones Ca are subsequently produced at parts of second sidewalls 2F2a of the second trenches G2a by oblique implantation (see FIG. 5). With the assistance of a second photoresist mask Pm2 that covers regions that the first photoresist mask Pm1 did not cover, channel stop zones Ca are produced by oblique implantation at first sidewalls 2F1a of the second trenches G2a (see FIG. 5). The dopant concentration of the channel stop zones Ca amounts to approximately $1 \times 10^{19}$ cm$^{-3}$.

Figure 6:
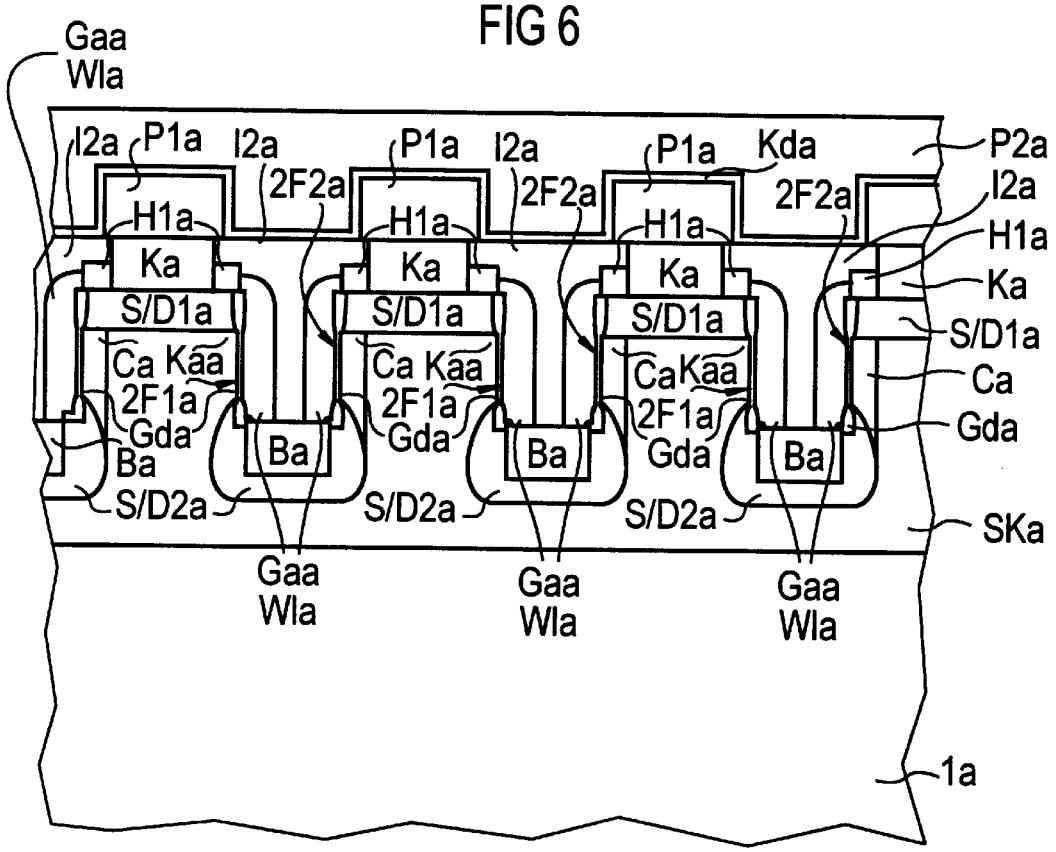
FIG. 6 shows the cross-section from FIG. 4a after a gate dielectric, word lines, gate electrodes, a second insulating structure, contacts, first capacitor plates, a capacitor dielectric and a second capacitor were produced.

An approximately 10 nm thick gate dielectric Gda is produced by thermal oxidation (see FIG. 6). For producing word lines W1a, n-doped polysilicon is deposited in a thickness of approximately 150 nm. Subsequently, polysilicon is etched with, for example, $C_2F_6$+$O_2$ until a part of the gate dielectric Gda that adjoins the second auxiliary layer H2a is uncovered. The uncovered parts of the gate dielectric Gda are removed by isotropic etching of $SiO_2$ with, for example, HF. Subsequently, polysilicon is etched until word lines W1a in the form of spacers arise at the first sidewalls 2F1a of the second trenches G2a and at the second sidewalls 2F2a of the second trenches G2a. Parts of the word lines W1a that adjoin the first source/drain regions SD/1a are suitable as gate electrodes Gaa (see FIG. 6).

Subsequently, $SiO_2$ is deposited in a thickness of approximately 500 nm and is planarized by chemical-mechanical polishing. A second insulating structure I2a arises as a result thereof (see FIG. 6).

$SiO_2$ is etched with the assistance of a photoresist mask until parts of the first source/drain regions S/D1a are uncovered. Contacts Ka for the first source/drain regions S/D1a are produced by deposition of approximately 400 nm tungsten and re-etching with, for example, $SF_6$ until the second insulating structure I2a is uncovered (see FIG. 6).

Subsequently, platinum is deposited in a thickness of approximately 200 nm. With the assistance of a photoresist mask that coves the contacts Ka, platinum is etched with, for example, $Cl_2$+$O_2$ until the second insulating structure I2a is uncovered for producing first capacitor plates P1a. Subsequently, $Ba_{0.5}Sr_{0.5}TiO_3$ is deposited in a thickness of approximately 20 nm, as a result whereof a capacitor dielectric case da is produced. A second capacitor plate P2a is produced by deposition of approximately 300 nm platinum (see FIG. 6).

Figure 7:
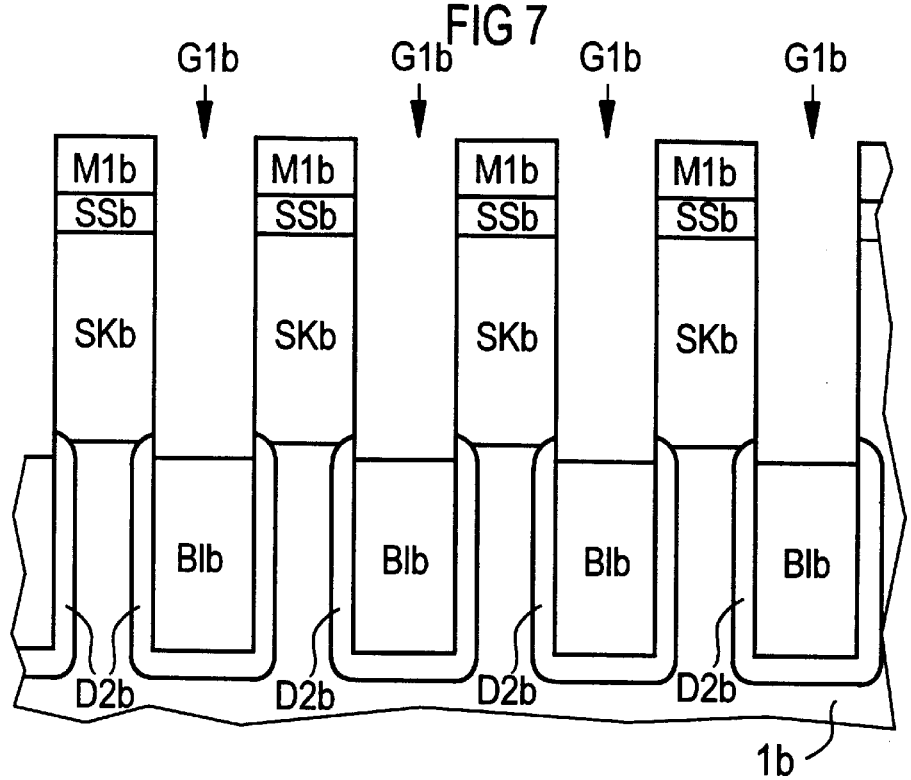
FIG. 7 shows a cross-section through a second substrate after a layer for channel regions, a layer for source/drain regions, a first mask, first trenches, bit lines and second diffusion regions were produced.

In a second exemplary embodiment, and analogous to the first exemplary embodiment, first trenches G1d are produced with a first mask M1b in a second substrate 1b that comprises a layer Skb for channel regions Kab and a layer SSb for first source/drain regions S/D1b (see FIG. 7). The first trenches G1b, by contrast to the first exemplary embodiment, are approximately 2 $\mu$m deep. For producing bit lines B1b at floors of the first trenches G1b, highly n-doped polysilicon is deposited in a thickness of approximately 400 nm, is planarized by chemical-mechanical polishing until the first mask M1b is uncovered, and is etched back approximately 1.2 $\mu$m deep. The bit lines B1b are thereby approximately 1 $\mu$m thick. For electrical insulation of the bit lines B1b from the substrate 1b, dopant of the bit lines B1b is driven out into the substrate 1b by tempering, as a result whereof second diffusion regions D2b arise (see FIG. 7).

As in the first exemplary embodiment, $SiO_2$ is deposited in a thickness of approximately 500 nm in a TEOS process for producing first insulating structures (not shown) and is planarized by chemical-mechanical polishing until the layer SSb for the first source/drain region S/D1b is uncovered.

Figure 8:
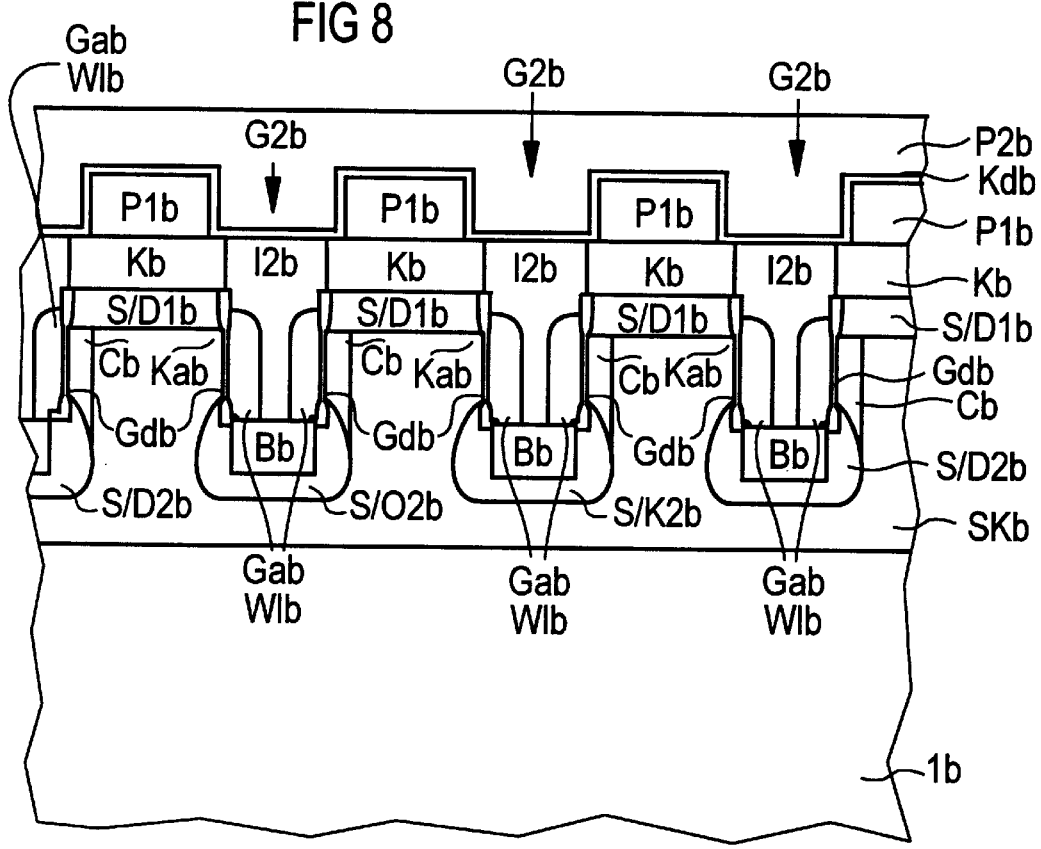
FIG. 8 shows a cross-section perpendicular to the cross-section of FIG. 7 after second trenches, second source/drain regions, first diffusion regions (not shown in this FIG.), floor structures, channel stop zones, a gate dielectric, word lines, gate electrodes, a second insulating structure, contacts, first capacitor plates, a capacitor dielectric and a second capacitor plate were produced.

As in the first exemplary embodiment, a first auxiliary layer (not shown), a second auxiliary layer (not shown), a third auxiliary layer (not shown), second trenches G2b, first source/drain regions S/D1b and channel regions Kab are produced. Differing from the first exemplary embodiment, the spacing between center lines of two neighboring, second trenches G2b amounts to approximately 1 $\mu$m. As in the first exemplary embodiment, second source/drain regions S/D2b, first diffusion regions (not shown), floor structures Bb for the second trenches G2b, channel stop zones Cb, first insulating structures (not shown) and a gate dielectric Gdb are produced. Subsequently, n-doped polysilicon is deposited in a thickness of approximately 150 nm and is planarized by chemical-mechanical polishing until parts of the gate dielectric Gdb that adjoin the secondary auxiliary layer H2b are uncovered. Subsequently, polysilicon is etched until the word lines W1b and, thus, the gate electrodes Gab in the form of spacers arise at sidewalls of the second trenches G2b. The word lines W1b are not adjacent at the second auxiliary layer H2b. Subsequently, $SiO_2$ is deposited in a thickness of approximately 500 nm and is planarized by chemical-mechanical polishing until the second auxiliary layer H2b is uncovered. As a result thereof, a second insulating structure I2b arises. The second auxiliary layer H2b is removed by etching polysilicon selectively relative to $SiO_2$ with, for example, $C_2F_6+O_2$. Subsequently, $SiO_2$ is etched with, for example, $CHF_3+O_2$ until the first source/drain regions S/D1b are uncovered and the first auxiliary layer H1b is removed. An upper edge of the second insulating structure I2b lies higher than the first source/drain regions S/D1b. Selfa aligned contacts Kb to the first source/drain regions S/D1b arise by deposition of n-doped polysilicon in a thickness of approximately 500 nm and subsequent chemical-mechanical polishing until the second insulating structure I2b is uncovered. Analogous to the first exemplary embodiment, first capacitor plates P1b, a capacitor dielectric Kdb and a second capacitor plate P2b are subsequently produced (see FIG. 8).

Figure 9:
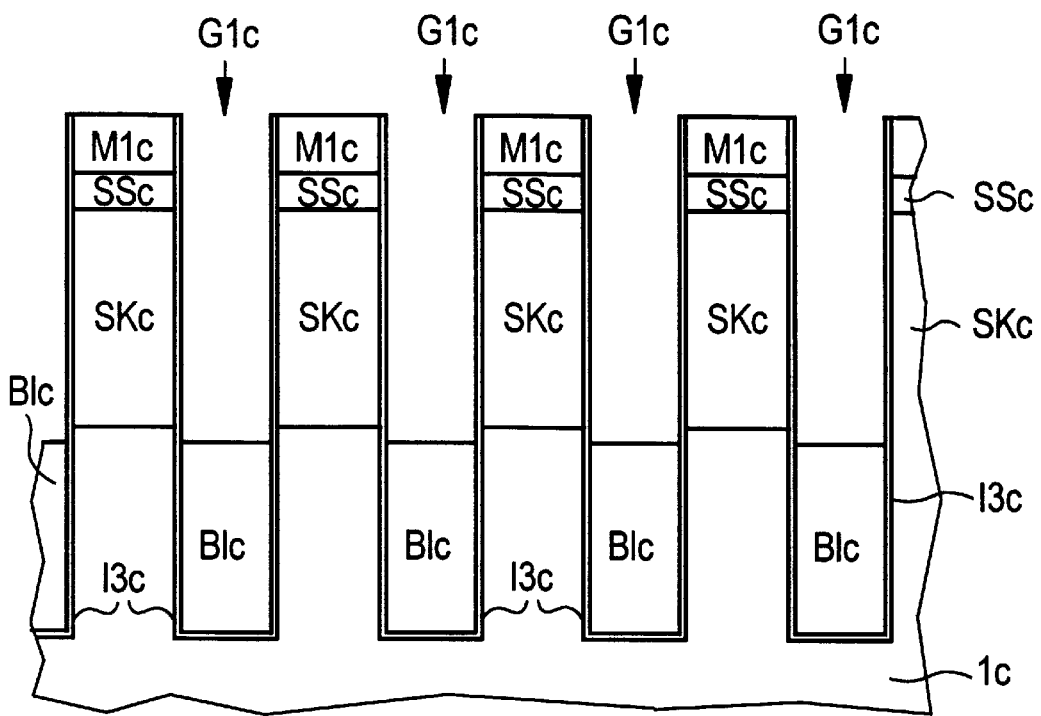
FIG. 9 shows a cross-section through a third substrate after a layer for channel regions, a layer for source/drain regions, a first mask, first trenches, a third insulating structure and bit lines were produced.

Analogous to the first exemplary embodiment, approximately 2 $\mu$m deep first trenches G1c are produced in a third exemplary embodiment in a third substrate 1c that comprises a layer SKc for channel regions Kac and a layer SSc for first source/drain regions S/D1c, being produced with the assistance of a first mask M1c (see FIG. 9). $SiO_2$ is deposited in a thickness of approximately 50 nm for producing a third insulating structure. Subsequently, tungsten silicide is deposited in a thickness of approximately 400 nm, is planarized by chemical-mechanical polishing until the first mask M1c is uncovered, and is then etched approximately 1.2 $\mu$m deep. For example, $SF_6$ is suitable as etchant Bit lines B1c arise as a result thereof. The bit lines B1c are insulated from the substrate 1c by the third insulating structure I3c (see FIG. 9). Subsequently, uncovered parts of the third insulating structure I3c are removed with, for example, HF.

For producing first insulating structures I1c, $SiO_2$ is deposited in a thickness of approximately 500 nm, as in the first exemplary embodiment, and is planarized by chemical-mechanical polishing until the first source/drain regions S/D1c are uncovered.

A first auxiliary layer H1c is produced by deposition of $SiO_2$ in a thickness of approximately 100 nm. A second auxiliary layer H2c is produced by deposition of polysilicon in a thickness of approximately 100 nm. A sixth auxiliary layer H6c is produced by deposition of $SiO_2$ in a thickness of approximately 100 nm. A seventh auxiliary layer H7c is produced by deposition of polysilicon in a thickness of approximately 100 nm. A third auxiliary layer H3c is produced by deposition of $SiO_2$ in a thickness of 100 nm (see FIG. 10). With the assistance of a photoresist mask, the third auxiliary layer H3c, the seventh auxiliary layer H7c, the sixth auxiliary layer H6c, the second auxiliary layer H2c and the first auxiliary layer H1c are structured. The third auxiliary layer H3c subsequently serves as mask in the production of second trenches G2c. To that end, silicon is etched approximately 500 nm deep selectively relative to $SiO_2$ with, for example, $Hbr+NF_3+He+O_2$.

Analogous to the first exemplary embodiment, second spacers Sp2c are produced at sidewalls of the second trenches G2c by deposition of $SiO_2$ in a thickness approximately 500 nm and re-etching. As in the first exemplary embodiment, second source/drain regions S/D2c are produced at floors of the second trenches G2c by implantation and tempering. The second source/drain regions S/D2c are approximately 300 nm deep. Their dopant concentration amounts to approximately $5 \times 10^{20}$ cm$^{-3}$. In the implantation, the second spacers Sp2c protect the sidewalls of the second trenches G2c (see FIG. 10). Due to the production of the second trenches G2c and of the first trenches G1c, the channel regions Kac arise from the layer FKc for the channel regions Kac and the first source/drain regions S/D1c arise from the layer for the first source/drain regions S/D1c. The first source/drain regions S/D1c and the channel regions Kac are laterally surrounded by the first trenches G1c and by the second trenches G2c.

Figure 10A:
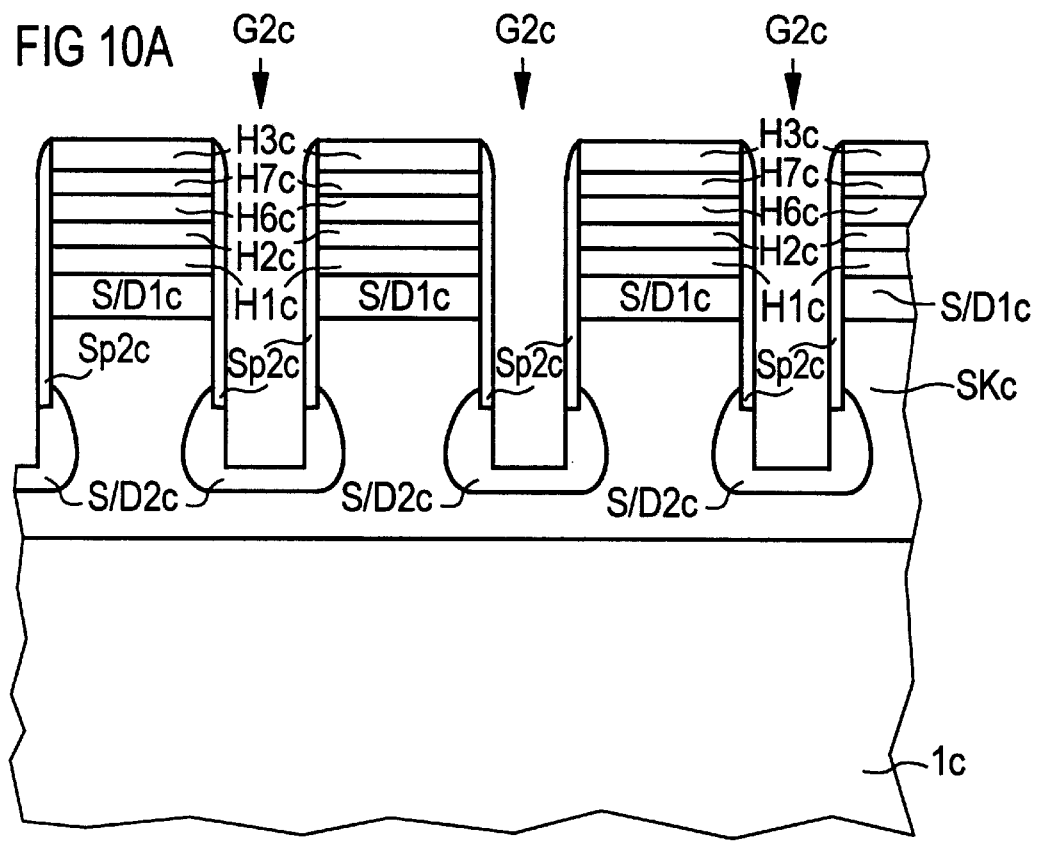
FIG. 10a shows a cross-section perpendicular to the cross-section of FIG. 9 through the third substrate after first insulating structures (shown in FIG. 10b), a first auxiliary layer, a second auxiliary layer, a fourth auxiliary layer, a fifth auxiliary layer, a third auxiliary layer, second trenches, second spacers and second source/drain regions were produced and the second trenches were partially etched somewhat deeper.
Figure 10B:
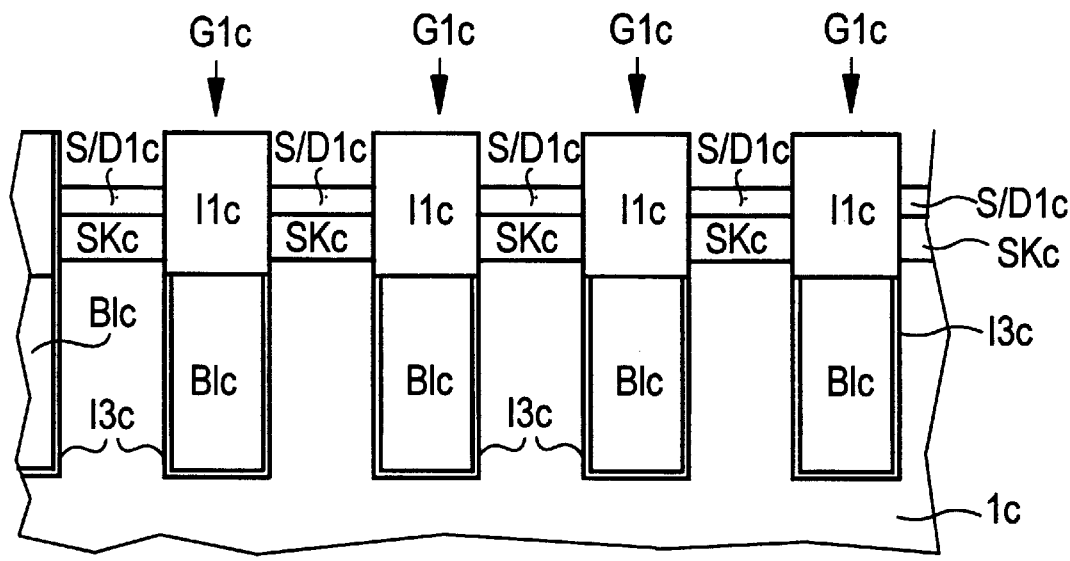

As in the first exemplary embodiment, silicon is subsequently etched, as a result whereof the second trenches G2a become approximately 200 nm deeper in regions outside the first trenches G1a (see FIG. 10).

Figure 11A:
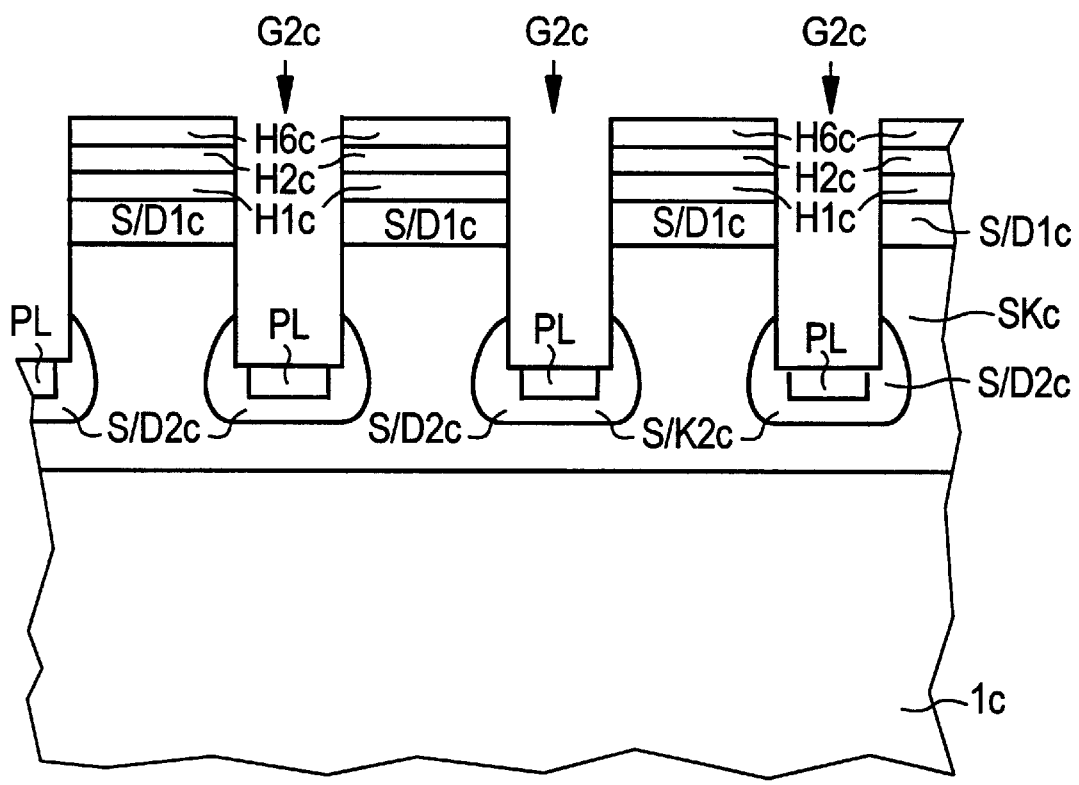
FIG. 11a shows the cross-section from FIG. 10a after a structure polysilicon and first diffusion regions were produced as part of conductive structures.

Subsequently, $SiO_2$ is deposited in a thickness of approximately 500 nm and is planarized by chemical-mechanical polishing until the seventh auxiliary layer H7c is uncovered. Subsequently, $SiO_2$ is etched within the second trenches G2c in regions that partially overlap with the first trenches G1c and partially do not overlap with the first trenches G1c until parts of the bit line B1c and parts of the second source/drain regions S/D2c are uncovered (see FIG. 11b). To that end, a stripe-shaped photoresist mask proceeding parallel to the first trenches G1c that partially overlaps the first trenches G1c is applied. The seventh auxiliary layer H7c protects parts of the sixth auxiliary layer H6c located outside the photoresist mask. For producing conductive structures Lc that respectively connect a bit line B1c and a second source/drain region S/D2c to one another, n-doped polysilicon is deposited in a thickness of approximately 400 nm and is planarized by chemical-mechanical polishing until the seventh auxiliary layer H7c is removed and the sixth auxiliary layer H6c is uncovered. Subsequently, re-etching is carried out to a depth of approximately 0.9 $\mu$m. A structure P1 of polysilicon arises as a result thereof (see FIG. 11a and FIG. 11b). The sixth auxiliary layer H6c thereby serves as mask and protects the second auxiliary layer H2c. For example, $C_2F_6+O_2$ is suitable as etchant. Dopant is driven out from the structure P1 of polysilicon into the substrate 1c by tempering. First diffusion regions D1c that electrically insulate the structure P1 of polysilicon from the substrate 1c arise as a result thereof. Together, a respective structure P1 of polysilicon and an appertaining, first diffusion region D1c form the conductive structure Lc (see FIG. 11b).

Figure 12B:
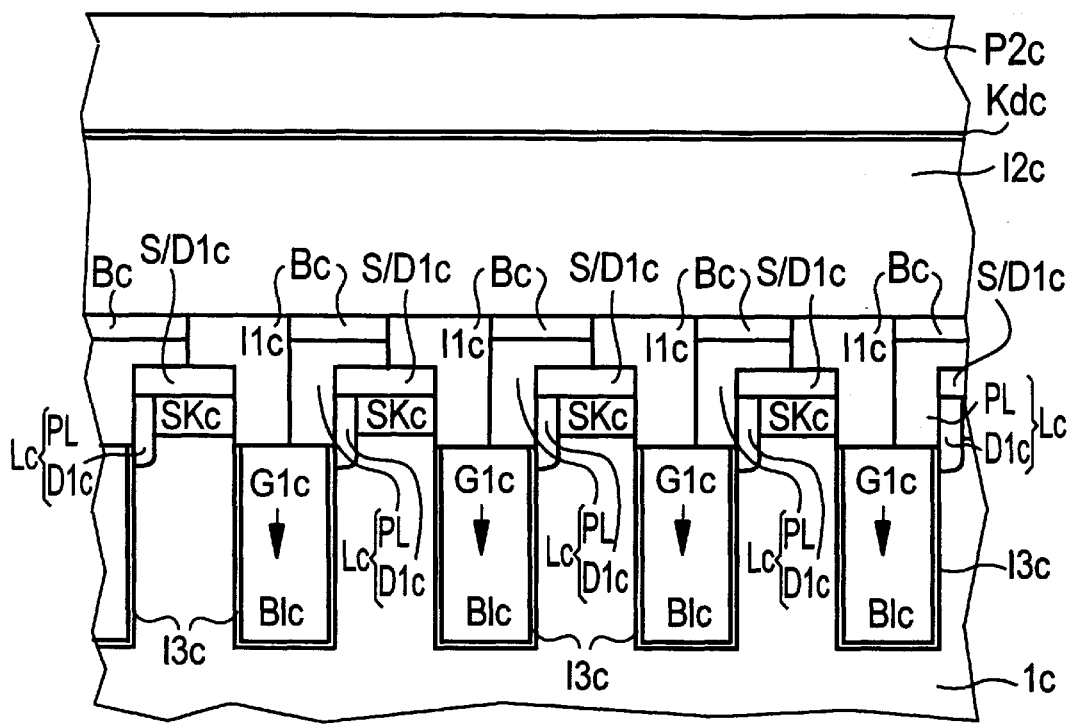

Subsequently $SiO_2$ is deposited in a thickness of approximately 500 nm and is planarized by chemical-mechanical polishing until the second auxiliary layer H2c is uncovered. The sixth auxiliary layer H6c is thereby removed. Subsequently, $SiO_2$ is etched approximately 700 nm deep, as a result whereof four structures Bc are produced that form planar floors of the second trenches G2c in the second trenches G2c (see FIG. 12a). Analogous to the first exemplary embodiment, channel stop zones Cc, a gate dielectric Gdc, word lines W1c, gate electrodes Gac, a second insulating structure I2c, contacts Kc, first capacitor plates P1c, a capacitor dielectric Kdc and a second capacitor plate P2c are subsequently generated (see FIG. 12a and FIG. 12b).

Figure 13:
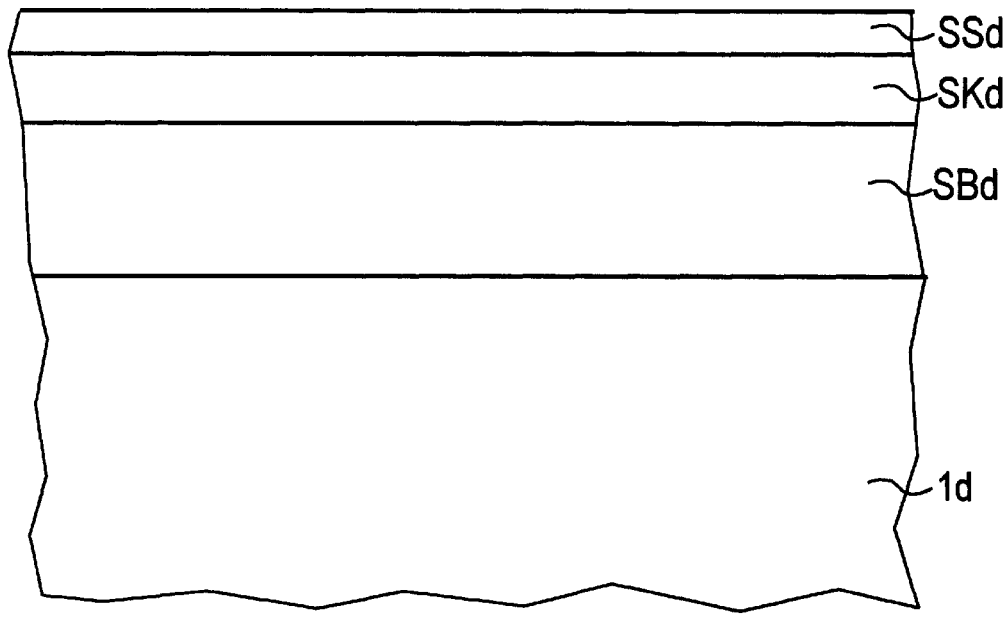
FIG. 13 shows a cross-section for the substrate after a layer for bit lines, a layer for channel regions and a layer for source/drain regions were produced.
Figure 14A:
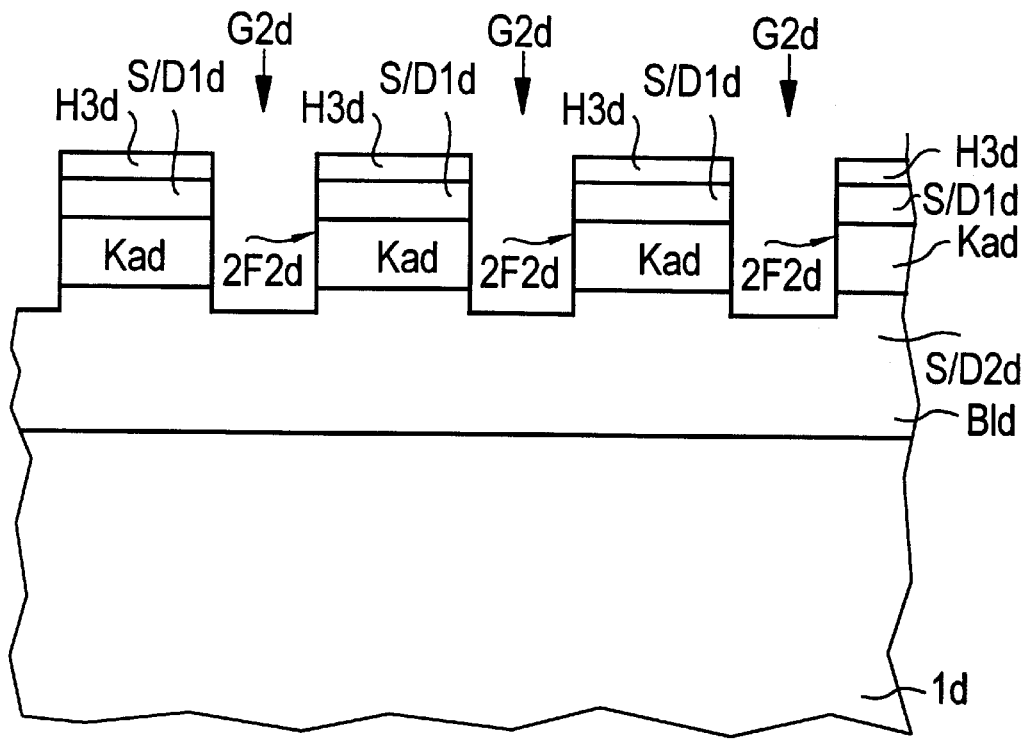
FIG. 14a shows the cross-section of FIG. 13 after first trenches (shown in FIG. 14b), first insulating structures (shown in FIG. 14b), a third auxiliary layer and second trenches were produced.
Figure 14B:
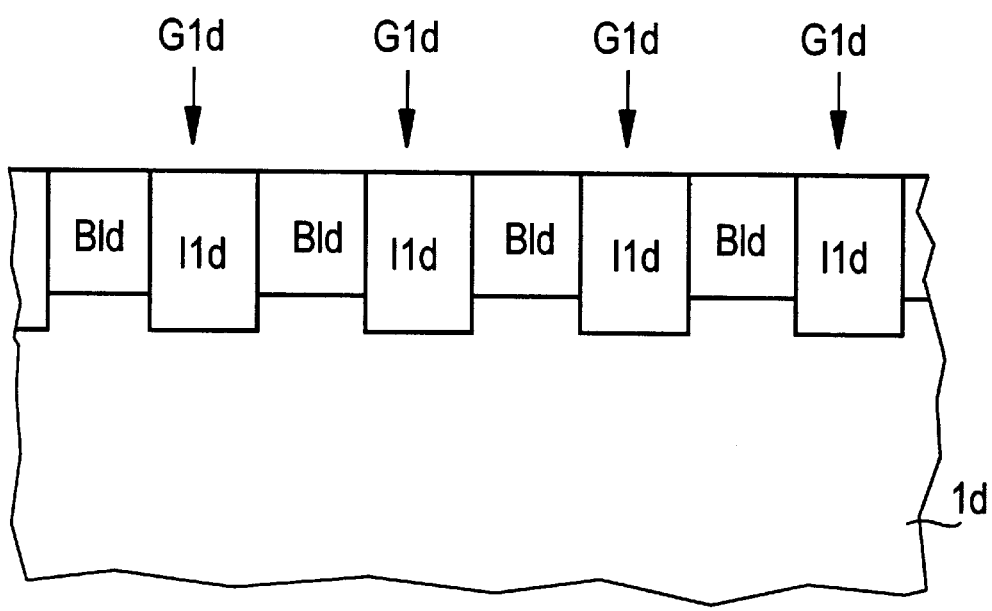
FIG. 14b shows a cross-section through the fourth substrate perpendicular to the cross-section of FIG. 14a after the process steps from FIG. 14a, the cross section proceeding along a second trench.

In a fourth exemplary embodiment, a fourth substrate Id is p-doped. The dopant concentration of the fourth substrate 1d amounts to approximately $10^{-15}$ cm$^{-3}$. At approximately 500 nm thick, n-doped layer SBd for bit lines B1d is produced by epitaxy. The dopant concentration of the layer SBd for the bit lines B1d amounts to approximately $5 \times 10^{20}$ cm$^{-3}$. An approximately 300 nm thick, p-doped layer SKd for channel regions Kad is generated thereabove by epitaxy. The dopant concentration of the layer SKd for channel regions Kad amounts to approximately $3 \times 10^{17}$ cm$^{-3}$. An approximately 150 nm thick, n-doped layer SSd for first source/drain regions S/D1$d$ is produced thereabove by epitaxy. The dopant concentration of the layer SSd for the first source/drain regions S/D1$d$ amounts to approximately 5×10$^{20}$ cm$^{-3}$ (see FIG. 13).

For producing a first mask (not shown), SiO$_2$ is deposited in a thickness of approximately 200 nm in a TEOS process and is structured by a photolithographic process. First trenches G1$d$ arise with the assistance of the first mask by etching silicon selectively relative to SiO$_2$. The spacing between center lines of neighboring first trenches G1$d$ amounts to approximately 1 $\mu$m. The first trenches G1$d$ cut through the layer SBd for the bit lines B1$d$. The bit lines B1$d$ thus arise from the layer SBd for the bit lines B1$d$.

Analogous to the first exemplary embodiment, first insulating structures I1$d$ are subsequently produced. The first insulating structures I1$d$ insulate neighboring bit lines B1$d$ from one another.

A third auxiliary layer H3$d$ of SiO$_2$ is deposited, structured by a photolithographic process together with the first insulating structure I1$d$, and is subsequently employed as second mask when etching silicon for producing second trenches G2$d$. Second sourceldrain regions S/D2$d$ are parts of the bit lines B1$d$ and, differing from the preceding exemplary embodiments, need not be produced at floors of the second trenches G2$d$. The second trenches G2$d$ extend to just below the layer SKd for the channel regions Kad and are approximately 500 nm deep. Due to the production of the second trenches G2$d$ and of the first trenches G1$d$, the channel regions Kad arise from the layer SKd for channel regions Kad and the first source/drain regions S/D1$d$ arise from the layer for the first source/drain regions S/D1$d$. The first source/drain regions S/D1$d$ and the channel regions Kad are laterally surrounded by the first trenches G1$d$ and by the second trenches G2$d$.

Subsequently, channel stop zones Cd are generated without mask by oblique implantation at second sidewalls 2F2$d$ of the second trenches G2$d$.

A gate dielectric Gdd is produced by thermal oxidation. Floors of the second trenches G2$d$ are essentially planar after the production of the gate dielectric Gdd as well.

Subsequently, n-doped polysilicon is deposited in a thickness of approximately 400 nm and is planarized by chemical-mechanical polishing until the third auxiliary layer H3$d$ is uncovered. Polysilicon is subsequently etched, as a result whereof a word line W1$d$ and, as part of the word line W1$d$, gate electrodes Gad arise in every second trench G2$d$.

For producing a second insulating structure I2$d$, SiO$_2$ is subsequently deposited in a thickness of approximately 500 nm and is planarized by chemical-mechanical polishing. SiO$_2$ is etched with the assistance of a mask that does not cover parts of the first source/drain regions S/D1$d$ until the parts of the first source/drain regions S/D1$d$ are uncovered. Contacts Kd are produced by deposition of tungsten in a thickness of approximately 400 nm and by etching with, for example, SF$_6$ until the second insulating structure I2$d$ is uncovered.

Figure 15A:
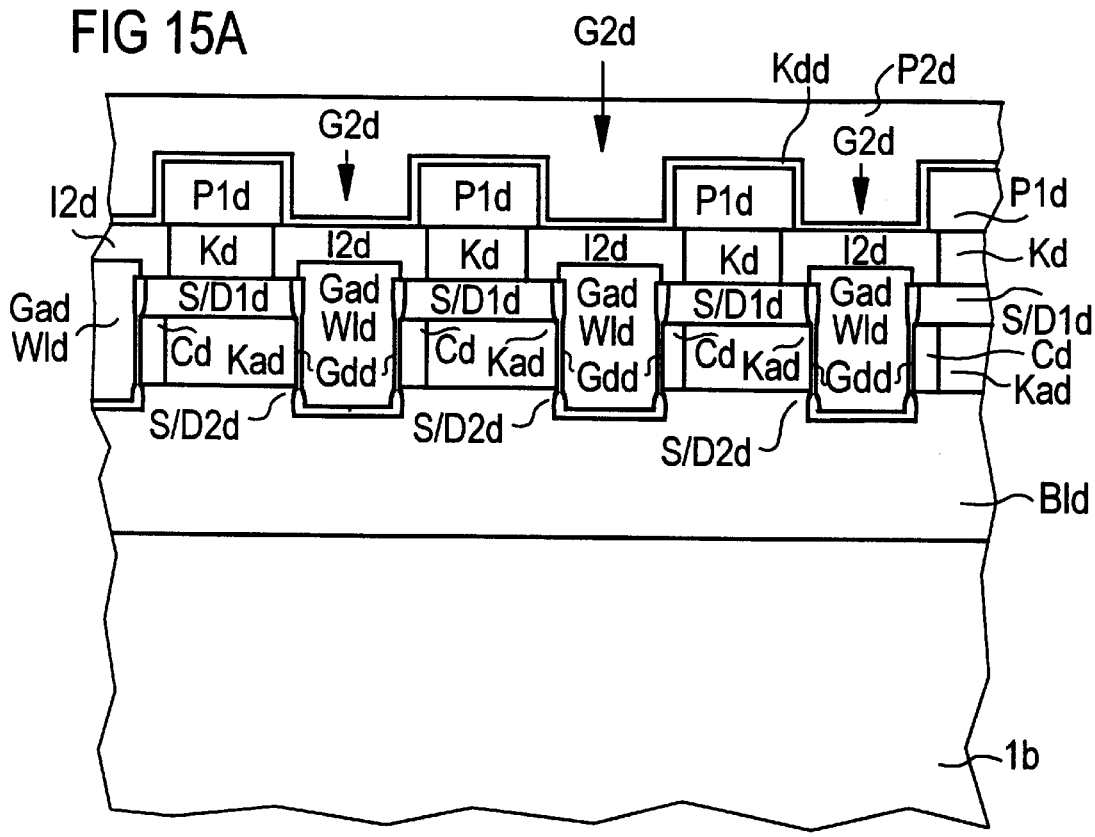
FIG. 15a shows the cross-section of FIG. 14a after channel stop zones, a gate dielectric, word lines, gate electrodes, a second insulating structure, contacts, first capacitor plates, a capacitor dielectric and a second capacitor plate were produced.
Figure 15B:
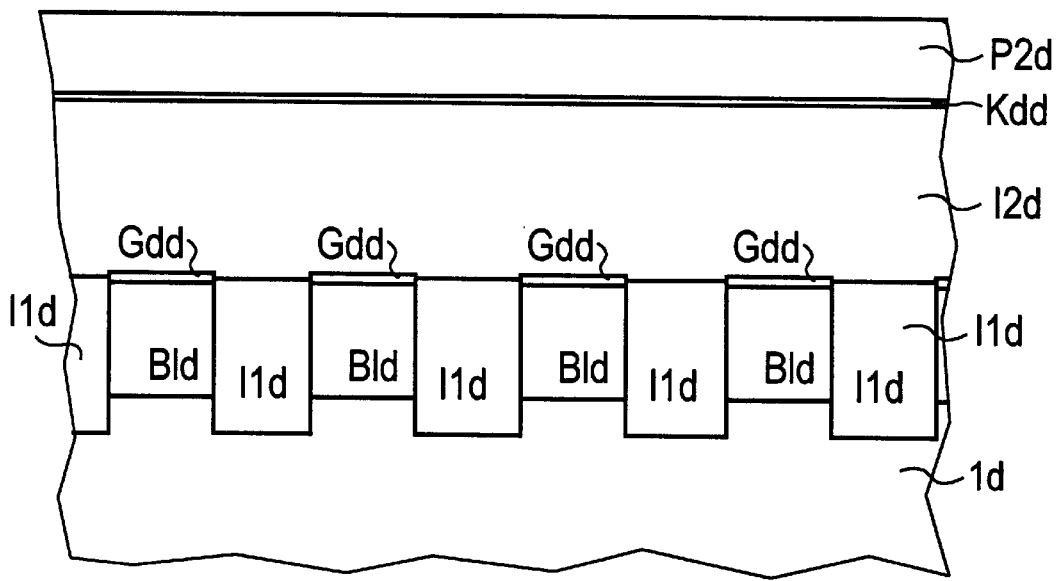

Analogous to the first exemplary embodiment, first capacitor plates P1$d$, a capacitor dielectric Kdd and a second capacitor plate P2$d$ are produced (see FIG. 15$a$ and 15$b$).

Figure 16:
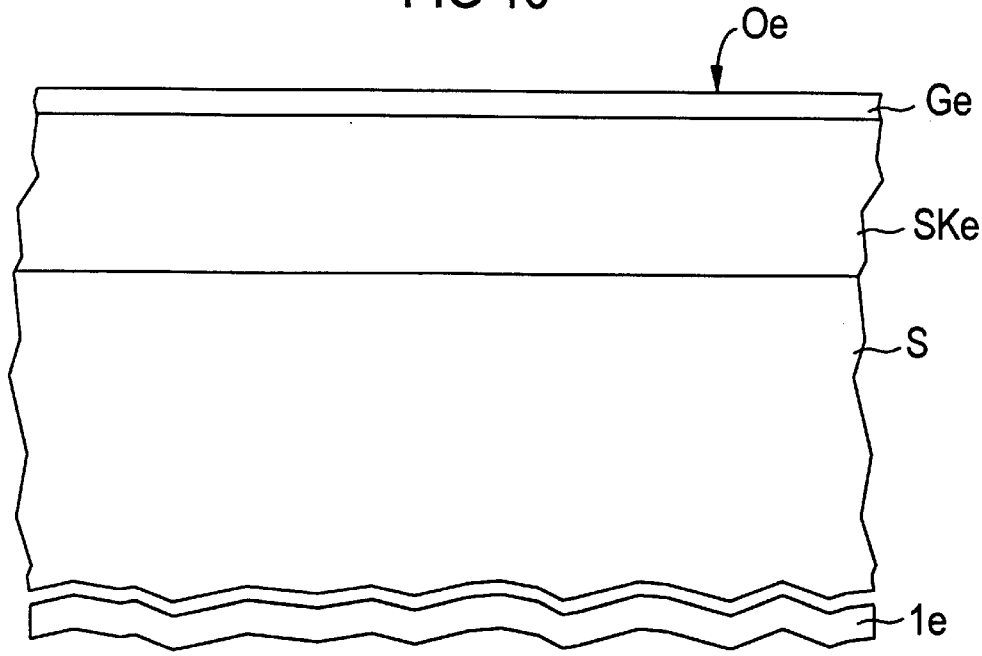
FIG. 16 shows a cross-section through a fifth substrate after a layer, a layer for channel regions and a doped region were produced.

In a fifth exemplary embodiment, a fifth substrate 1e is n-doped in a layer S adjoining a surface Oe of the fifth substrate 1e. The dopant concentration of the layer S amounts to approximately 10$^{20}$ cm$^{-3}$. A p-doped layer Ske for channel regions Kae is produced by epitaxy. The dopant concentration of the layer Ske for channel regions Kae amounts to approximately 10$^{17}$ cm$^{-3}$ (see FIG. 16). On the basis of a photolithographic process, n-doped, strip-shaped regions Ge proceeding parallel to one another are produced for second source/drain regions S/D2$e$. The dopant concentration of the regions Ge amounts to approximately 5×10$^{20}$ cm$^{-3}$. The regions Ge are approximately 150 nm deep (see FIG. 16).

Figure 17:
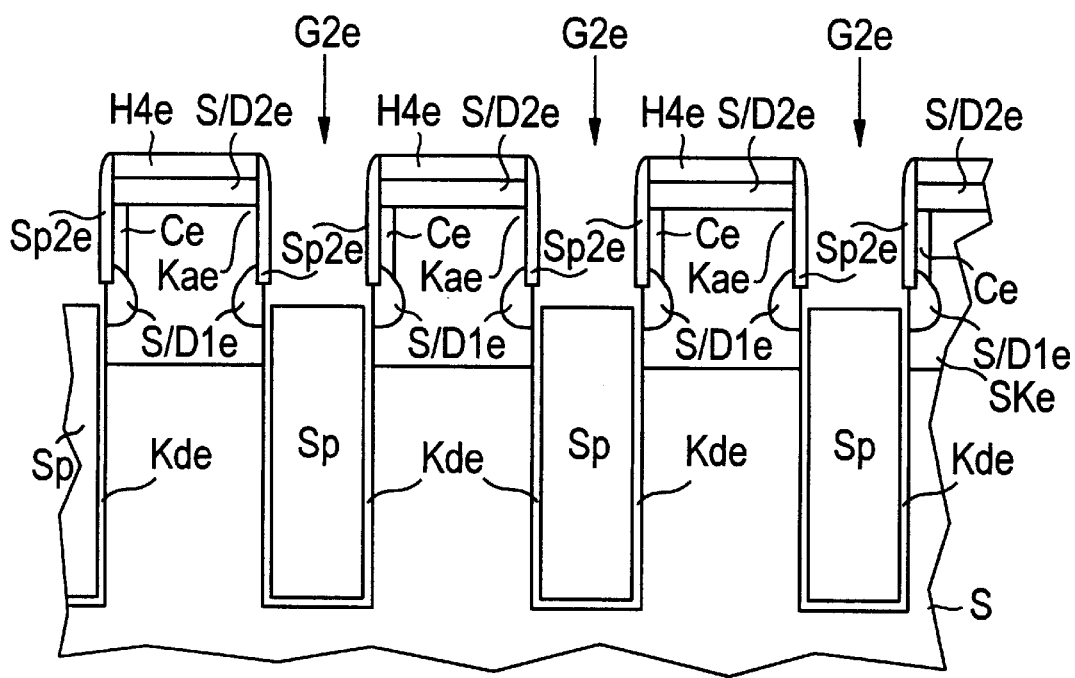
FIG. 17 shows the cross-section of FIG. 16 after a fourth auxiliary layer, second trenches, channel stop zones, first source/drain regions, a capacitor dielectric and storage nodes were produced.

A fourth auxiliary layer H4$e$ is produced by deposition of SiO$_2$ in a thickness of approximately 150 nm. A fifth auxiliary layer (not shown) is produced by deposition of polysilicon in a thickness of approximately 150 nm. A third auxiliary layer (not shown) is produced by deposition of SiO$_2$ in a thickness of approximately 150 nm (see FIG. 17). The third auxiliary layer, the fifth auxiliary layer and the fourth auxiliary layer H4$e$ are structured by a photolithographic process. Second trenches G2$e$ proceeding transverse to the regions Ge and parallel to one another are produced by etching silicon selectively relative to SiO$_2$, whereby the structured, third auxiliary layer serves as mask. The distance between center lines of two neighboring, second trenches amounts to approximately 1 $\mu$m. The second trenches G2$e$ are approximately 600 nm deep. For example, HBrF is suitable as etchant. SiO$_2$ is subsequently etched until the third auxiliary layer is removed.

As in the first exemplary embodiment, channel stop zones Ce are subsequently produced, whereby the first trenches G1$a$ correspond to regions lying between the regions Ge. The second trenches G2$e$ are filled with SiO$_2$ by deposition of SiO$_2$ in a thickness of approximately 500 nm and by chemical-mechanical polishing until the fifth auxiliary layer is uncovered.

SiO$_2$ is etched with the assistance of a photoresist mask that does not cover the regions Ge, as a result whereof depressions in which the SiO$_2$ was removed arise in parts of the second trenches G2$e$. The fifth auxiliary layer thereby protects the fourth auxiliary layer H4$e$. SiO$_2$ is deposited in a thickness of approximately 50 nm and re-etched for producing second spacers Sp2$e$. Subsequently, first source/ drain regions S/D1$e$ are produced by implantation at floors of the second trenches G2$e$. The second spacers Sp2$e$ protects sidewalls of the second trenches G2$e$ in the implantation. The dopant concentration of the first source/drain regions S/D1$e$ amounts to approximately 5×10$^{20}$ cm$^{-3}$. The first source/drain regions S/D1$e$ are approximately 300 nm deep. The dopant is activated by tempering (see FIG. 17).

Figure 18:
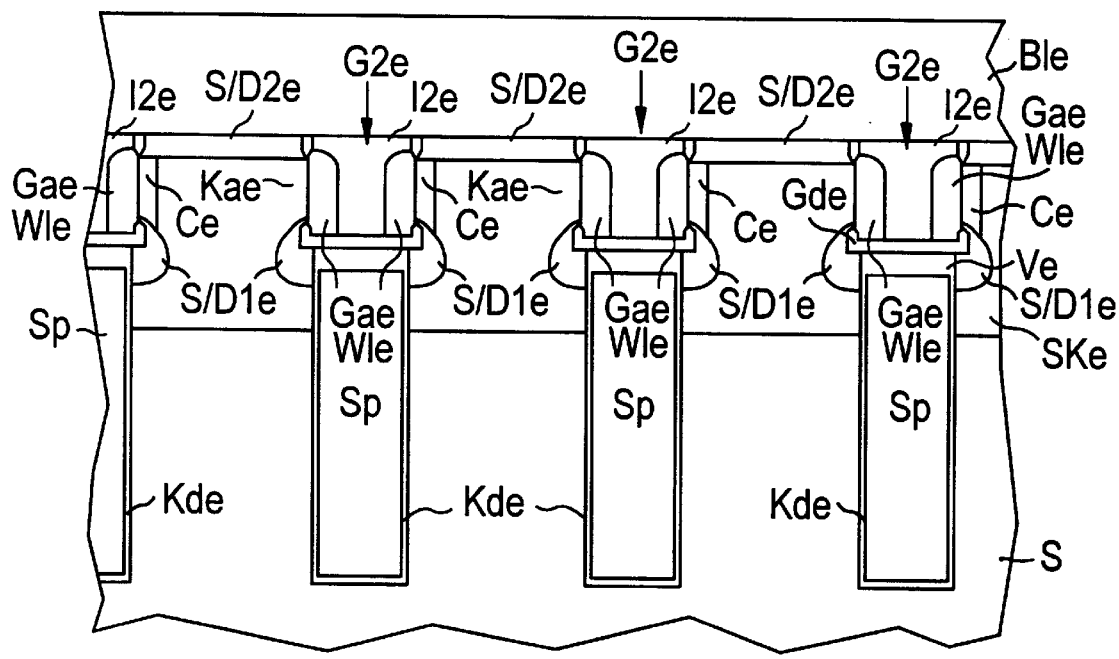
FIG. 18 shows the cross-section of FIG. 17 after a connection, a gate dielectric, a second insulating structure, word lines, gate electrodes and bit lines were produced.

Silicon is subsequently selectively etched relative to SiO$_2$, as a result whereof the fifth auxiliary layer is removed and the depressions become approximately 10 $\mu$m deeper. An approximately 9 nm thick ONO layer is formed for generating a capacitor dielectric Kbe. To that end, approximately 3 nm SiO$_2$ is first grown by thermal oxidation and approximately 6 nm silicon nitride is then deposited, this being subsequently oxidized approximately 3 nm deep by thermal oxidation. Subsequently, doped polysilicon is deposited in a thickness of approximately 300 nm and is planarized by chemical-mechanical polishing until the fourth auxiliary layer H4$e$ is uncovered. Subsequently, polysilicon is etched approximately 1150 nm deep selectively relative to SiO$_2$. Storage nodes Sp of capacitors thereby arrives. Uncovered parts of the capacitor dielectric Kde are removed by isotropic etching with, for example, CF$_4$ plasma (see FIG. 17). For producing connecting elements Ee that electrically connect the storage nodes Sp to the first source/drain regions S/D1$e$, polysilicon is deposited in a thickness of approximately 300 nm and is planarized by a chemical-mechanical polishing until the fourth auxiliary layer H4$e$ is uncovered. Subsequently, polysilicon is re-etched until the connecting elements Ve, which can be considered parts of the storage nodes Sp, arise. Subsequently, SiO₂ is etched until the second spacers Sp2e and the fourth auxiliary layer H4e are removed. For example, HF is suitable as etchant. An approximately 10 nm thick gate dielectric Gde is grown by thermal oxidation. For producing word lines W1e and gate electrodes Gae, polysilicon is deposited in a thickness of approximately 150 nm and is re-etched until the word lines W1e and, thus, the gate electrode Gae in the form of spacers arise at sidewalls of the second trenches G2e. The word lines W1e lie more deeply than the surface Oe. SiO₂ is deposited in a thickness of approximately 500 nm for producing a second insulating structure I2e and is planarized by chemical-mechanical polishing until the second source/drain regions S/D2e are uncovered. Subsequently, tungsten is deposited in thickness of approximately 500 nm and is structured by a photolithographic process. Bit lines B1e that are stripe-shaped, proceed parallel to one another, proceed perpendicular to the word lines W1e and are adjacent to the second source/drain regions S/De thereby arise (see FIG. 18).

Many variations of the five exemplary embodiments are conceivable that likewise lie within the scope of the invention. In particular, the dimensions of the described layers, regions and trenches can be adapted as desired to the respective requirements. The same is also true of the proposed dopant concentrations. Re-etching can also be employed instead of chemical-mechanical polishing. Conductivity types can be interchanged. Other conductor materials are also suitable as material for the contacts. A TEOS process can also be employed instead of thermal oxidation. For example, phosphorous silicate glass or borophosphorous silicate glass can also be employed instead of borosilicate glass. For example, AlSiCu, copper or aluminum can be employed instead of tungsten.

As in the fourth exemplary embodiment, the floor structures of the second trenches G2d can be foregone in the exemplary embodiments 1–3. An additional depression of parts of the second trenches can then also be foregone. Conversely, floor structures can be produced in the fourth exemplary embodiment. In order to obtain a reasonable vertical tolerance for setting the height of the floor structures, the second trenches can, for example, be etched 200 nm more deeply.

The first source/drain regions from the exemplary embodiment 2 can also be connected to the first capacitor plates by contacts that are produced by masked etching (exemplary embodiments 1, 3 and 4) or without contacts (exemplary embodiment 5). The first source/drain regions from the exemplary embodiments 1, 3 and 4 also be connected to the first capacitor plates by self-aligned contacts (exemplary embodiment 2) or without contacts (exemplary embodiment 5). The first source/drain regions from exemplary embodiment 5 can also be connected to the bit lines by self-aligned contacts (exemplary embodiment 2) or by contacts that are produced by masked etching (exemplary embodiments 1, 3 and 4).

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A DRAM cell arrangement, comprising:
   memory cells, each of the memory cells having a selection transistor structured as a vertical MOS transistor and a storage capacitor;
   a semiconductor structure having two sidewalls lying opposite one another;
   the semiconductor structure having at least a first source/drain region of two source/drain regions and a channel region of the selection transistor arranged therebelow;
   the first source/drain region being located at the two sidewalls of the semiconductor structure;
   the channel region being located adjacent a first sidewall of the two sidewalls of the semiconductor structure at which a first gate dielectric is adjacent;
   a gate electrode that is connected to a first word line being located at the first gate dielectric;
   an element that prevents formation of a channel as a channel stop zone, the element being located at a second sidewall of the two sidewalls of the semiconductor structure at a height of the channel region of the selection transistor;
   a second word line located next to the element that prevents the formation of a channel and outside the semiconductor structure;
   the first source/drain region connected to the storage capacitor; and
   the second source/drain region connected to a bit line that proceeds transverse to the first word line.

2. The DRAM cell arrangement according to claim 1, wherein word lines and bit lines proceed substantially straight,
   wherein a respective word line proceeds along second trenches,
   wherein first sidewalls of semiconductor structures of memory cells neighboring along the word line coincides with a first sidewall of a second trench,
   wherein second sidewalls of the semiconductor structures of memory cells neighboring along the word line coincide with a second sidewall of another second trench,
   wherein elements that prevent formation of channels of memory cells neighboring along the bit line are one of all arranged at first sidewalls or all arranged at second sidewalls of second trenches,
   wherein gate electrodes of selection transistors of memory cells neighboring along the word line are connected to the word line,
   wherein the gate electrodes are parts of the word lines.

3. The DRAM cell arrangement according to claim 1, wherein the second source/drain region is arranged above the first source/drain region with reference to an axis that proceeds perpendicular to a surface of a substrate, and
   wherein the storage capacitor is arranged within the substrate.

4. The DRAM cell arrangement according to claim 1, wherein the first source/drain region is arranged above the second source/drain regions with reference to an axis that proceeds perpendicular to a surface of a substrate, and
   wherein the second source/drain region is part of the bit line, and
   wherein neighboring bit lines are separated from one another by a first insulating structure.

5. The DRAM cell arrangement according to claim 1, wherein the bit line is arranged below and laterally relative to the second sourceldrain region with reference to an axis that proceeds perpendicular to a surface of a substrate, and wherein the bit line is connected to the second source/drain region via a conductor structure, and wherein the channel region is arranged over the second source/drain region and the first source/drain region is arranged over the channel region.

6. The DRAM cell arrangement according to claim 5, wherein a second fusion region surrounds the bit line, wherein the substrate is doped with a first conductivity type, wherein the second diffusion region is doped with a second conductivity type opposite the first conductivity type, and wherein the conductive structure has a first diffusion region.

7. The DRAM cell arrangement according to claim 5, wherein the bit line is electrically insulated from the substrate by a third insulating structure, and wherein the conductor structure has doped polysilicon and a first diffusion region.

8. The DRAM cell arrangement according to claim 5, wherein the bit line is arranged as a region doped by a second conductivity type within the substrate that is doped with a first conductivity type opposite the second conductivity type, and wherein the conductive structure has a first diffusion region.

9. The DRAM cell arrangement according to claim 1, wherein the arrangement further comprises folded bit lines, wherein word lines and bit lines proceed substantially straight, wherein respectively two of the word lines proceed along second trenches, wherein first sidewalls of semiconductor structures of memory cells neighboring along one of the word lines coincide with a first sidewall of one of the second trenches, wherein the second sidewalls of the semiconductor structures of the memory cells neighboring along the word line coincide with a second sidewall of a neighboring second trench, wherein elements that prevent formation of channels of memory cells that neighbor one another along the word line are arranged in alternation at the first sidewall of the second trench and at the second sidewall of the neighboring second trench, wherein gate electrodes of selection transistors of every second memory cell neighboring along the word line are connected to the word line, and wherein the gate electrodes are parts of the word lines.

10. The DRAM cell arrangement according to claim 9, wherein elements that prevent formation of channels of memory cells neighboring along the bit line are one of all arranged at first sidewalls or all arranged at second sidewalls of second trenches.

11. The DRAM cell arrangement according to claim 2, wherein elements that prevent formation of channels memory cells are one of all arranged at first sidewalls or all arranged at second sidewalls of second trenches.

* * * * *